United States Patent [19]
Tanaka et al.

[11] Patent Number: 5,477,495
[45] Date of Patent: Dec. 19, 1995

[54] NONVOLATILE SEMICONDUCTOR MEMORY APPARATUS

[75] Inventors: Yoshiyuki Tanaka, Tokyo; Tomoharu Tanaka, Yokohama; Koji Sakui, Tokyo; Hiroshi Nakamura; Kazunori Ohuchi, both of Yokohama; Hideko Oodaira, Tokyo; Yutaka Okamoto, Kawasaki, all of Japan

[73] Assignee: Kabushiki Kaisha Toshiba, Kawasaki, Japan

[21] Appl. No.: 225,926

[22] Filed: Apr. 11, 1994

Related U.S. Application Data

[62] Division of Ser. No. 950,147, Sep. 24, 1992, abandoned.

[30] Foreign Application Priority Data

Sep. 24, 1991 [JP] Japan .................... 3-243742
Jul. 2, 1992 [JP] Japan .................... 4-175516

[51] Int. Cl.⁶ .................................................. G11C 7/00
[52] U.S. Cl. ................ 365/203; 365/204; 365/185.13; 365/185.17
[58] Field of Search ................ 365/189.05, 189.01, 365/203, 230.08, 185, 205, 200, 201, 204

[56] References Cited

U.S. PATENT DOCUMENTS

| | | | |
|---|---|---|---|
| 4,253,163 | 2/1981 | Komoriya et al. | 365/205 |
| 4,608,670 | 8/1986 | Duvvurm et al. | 365/205 |
| 4,811,294 | 3/1989 | Kobayashi et al. | 365/185 |
| 4,858,195 | 8/1989 | Soneda | 365/205 |
| 4,932,002 | 6/1990 | Houston | 365/205 |
| 4,939,690 | 7/1990 | Momodomi et al. | 365/185 |
| 5,031,145 | 7/1991 | Lever | 365/205 |
| 5,034,922 | 7/1991 | Burgess | 365/189.05 |
| 5,075,890 | 12/1991 | Itoh et al. | 365/185 |
| 5,088,060 | 2/1992 | Endoh et al. | 365/185 |
| 5,204,839 | 4/1993 | Lee et al. | 365/204 |
| 5,293,337 | 3/1994 | Aritome et al. | 365/185 |

*Primary Examiner*—David C. Nelms
*Assistant Examiner*—Tan Nguyen
*Attorney, Agent, or Firm*—Oblon, Spivak, McClelland, Maier, & Neustadt

[57] ABSTRACT

A nonvolatile semiconductor memory apparatus of the present invention has a feature that charging of a control gate of a nonselective memory cell is simultaneously executed upon charging of a bit line. That is, in the case of normal reading (random accessing), charging of the control gate of the nonselective memory cell is conducted previously to at least one of source and drain side selective gates. Then, when the threshold value of the memory cell in the case of erasing the cell is judged, in a read mode, charging of the selective gate is started by delaying from the timing of charging the control gate of the nonselective memory cell to negative. That is, the selective gate is closed until the control gate is completely set to a negative testing voltage to prevent the bit line from being discharged. After the control gate is completely set to the negative testing voltage, the selective gate is delayed to be charged so that the selective gate is turned ON.

22 Claims, 32 Drawing Sheets

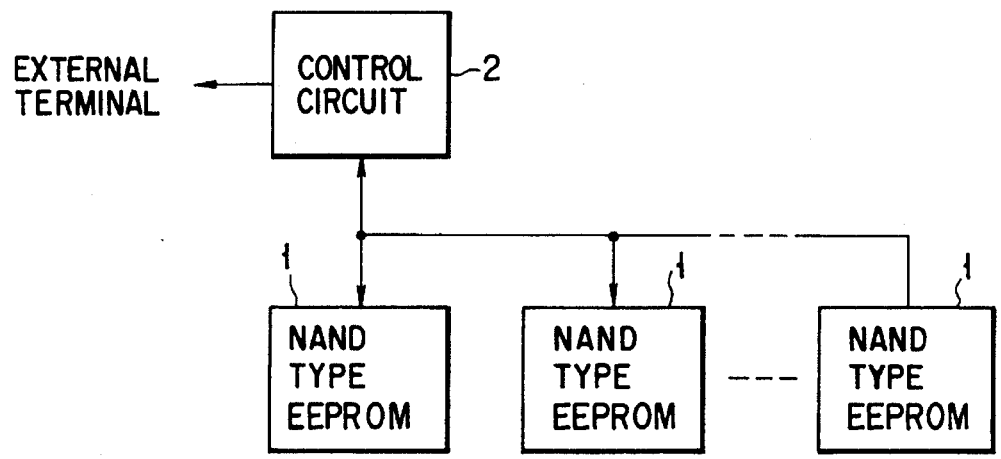
F I G. 2
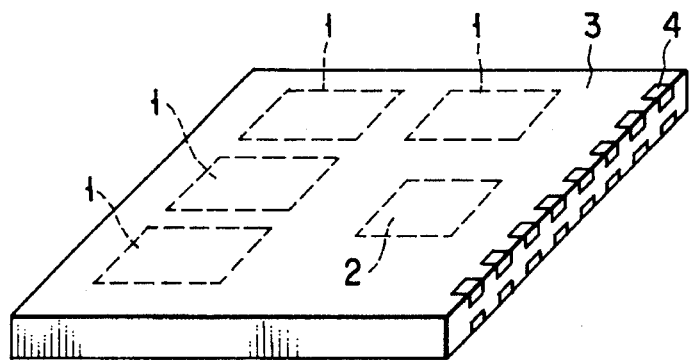
F I G. 3A
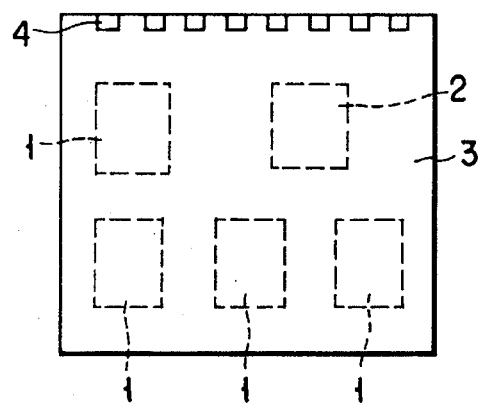
F I G. 3B

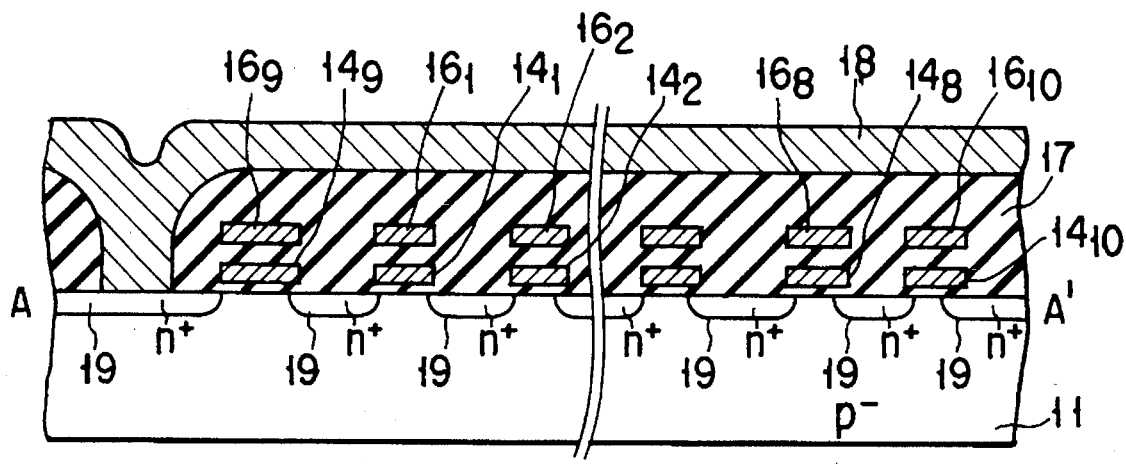
F I G. 6A
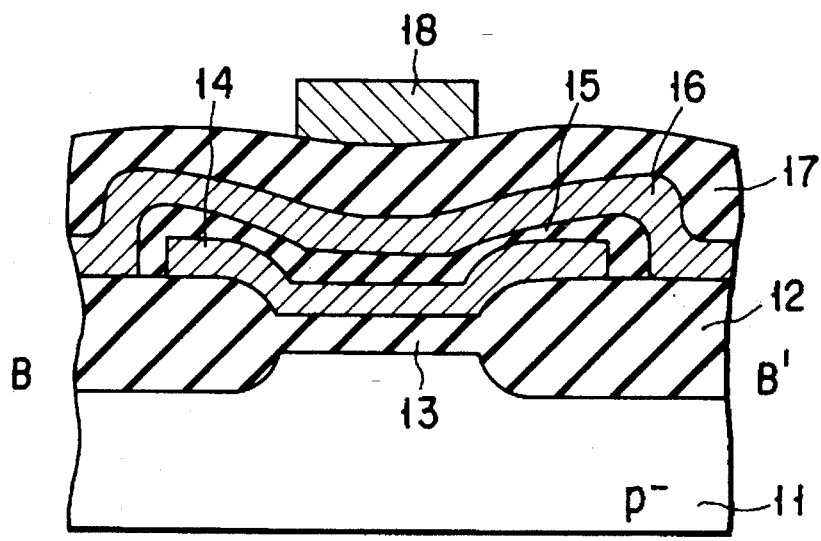
F I G. 6B

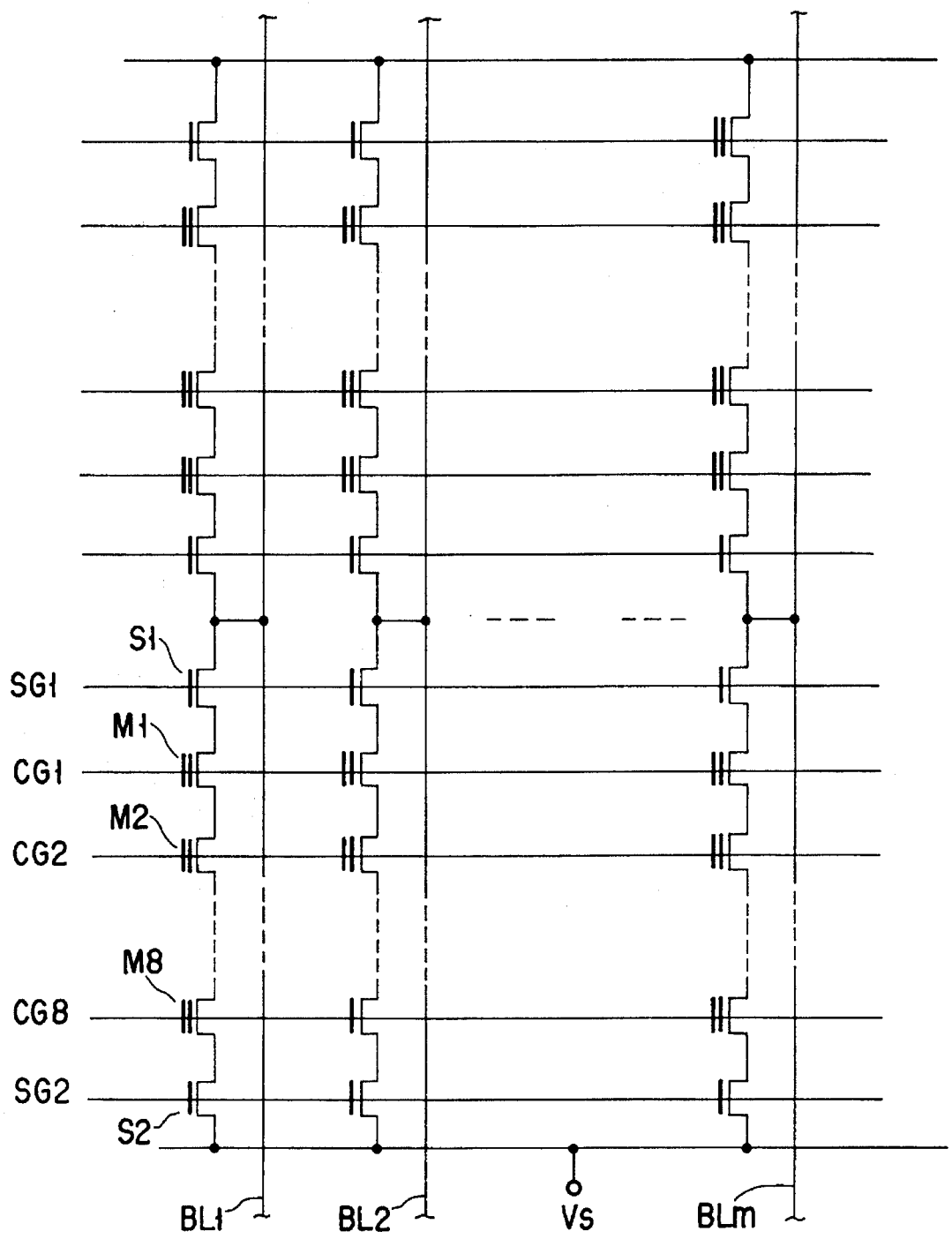
F I G. 7

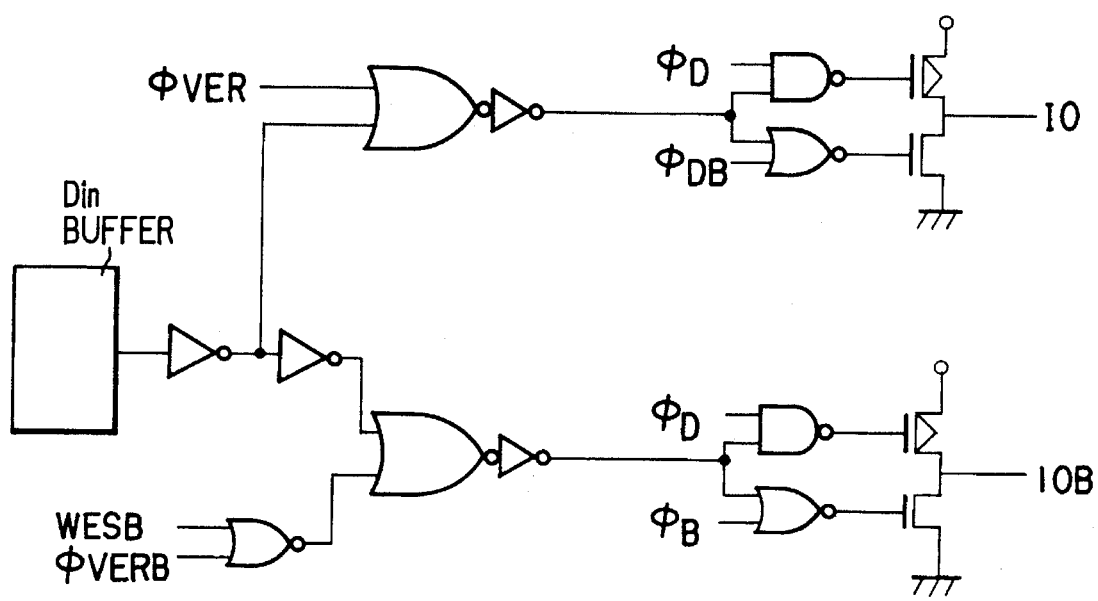
F I G. 11

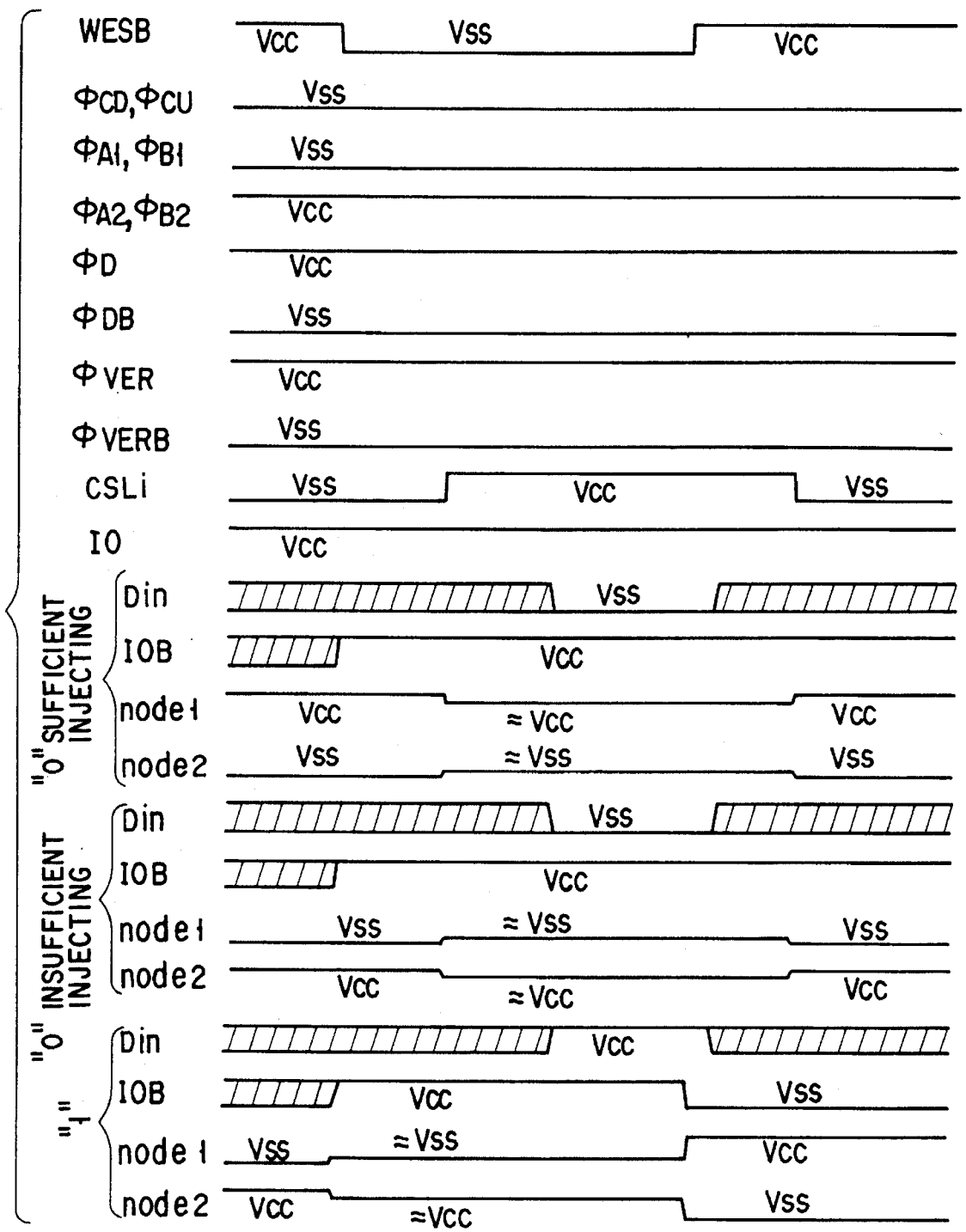
F I G. 13

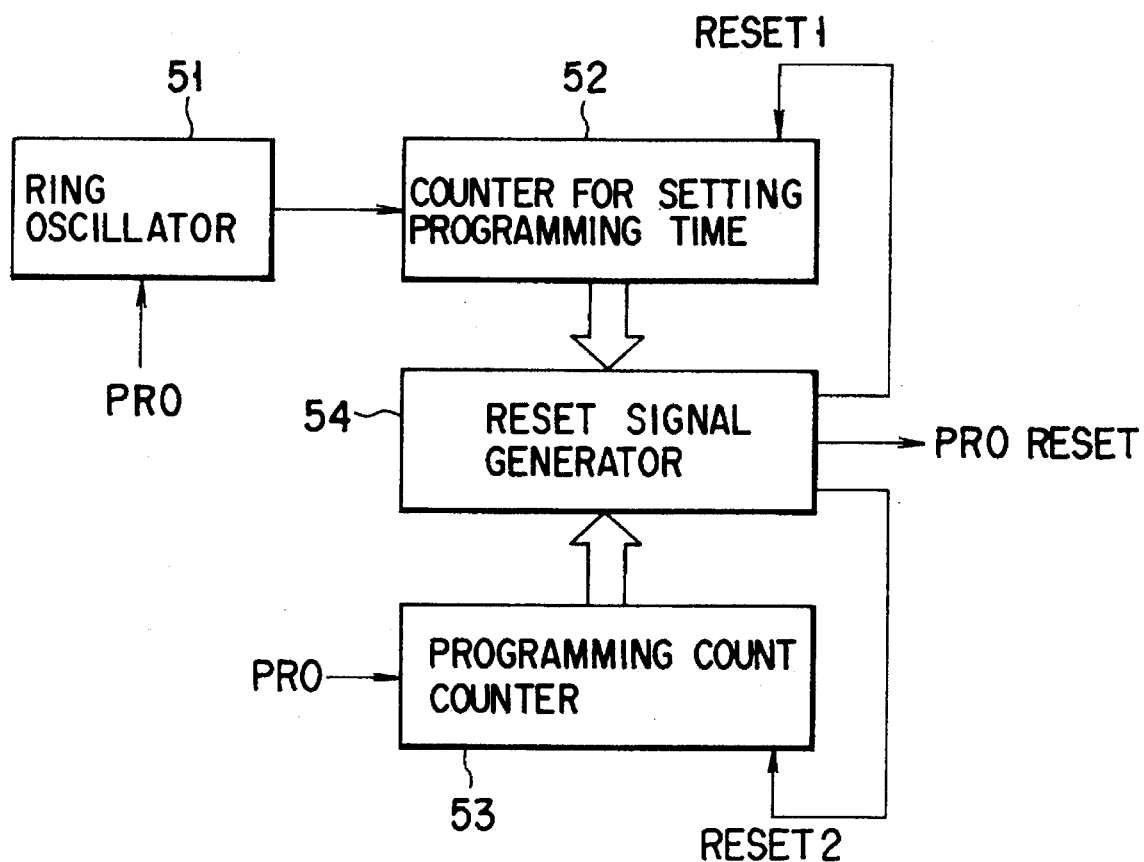
F I G. 15

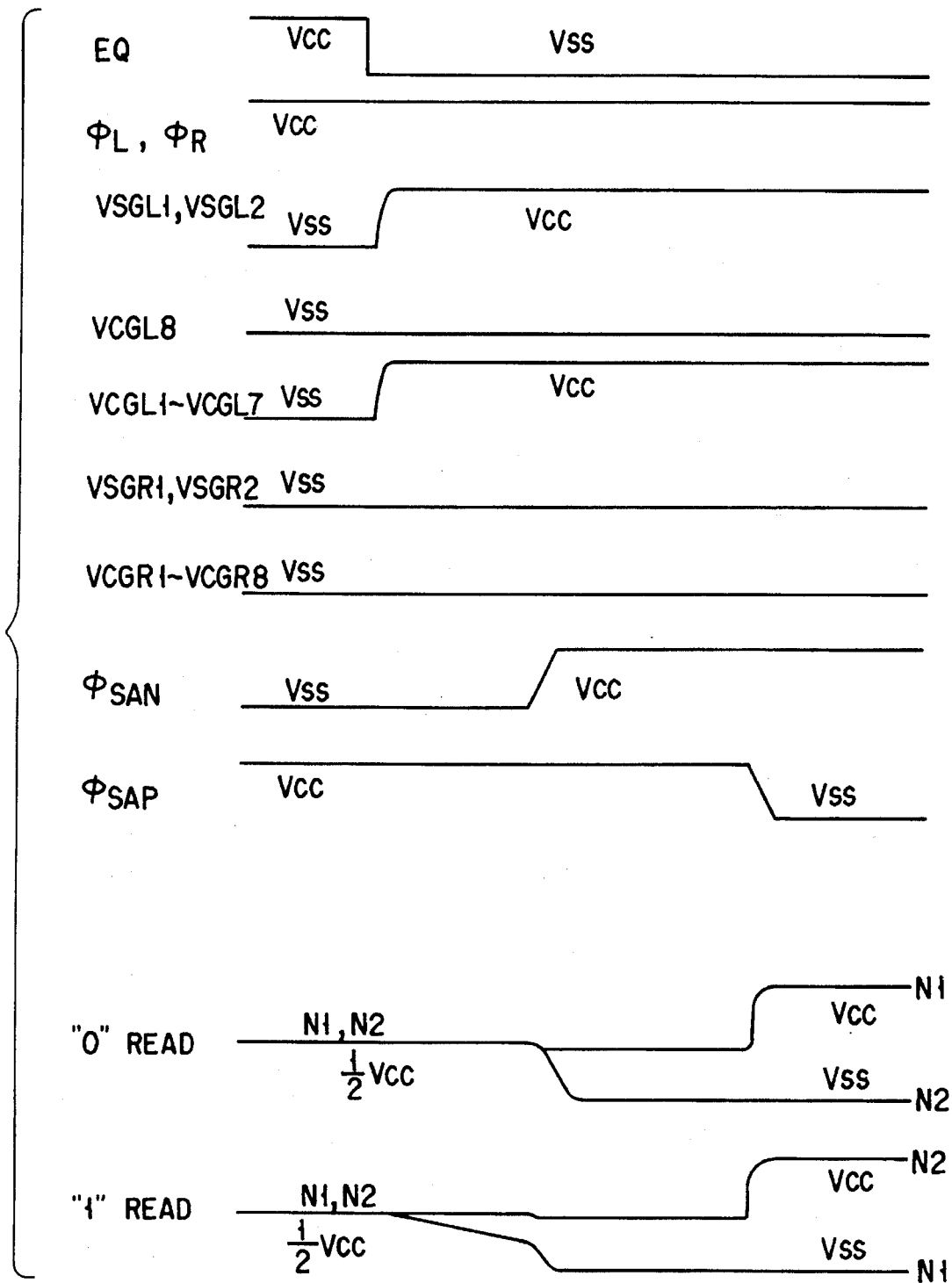
F I G. 19

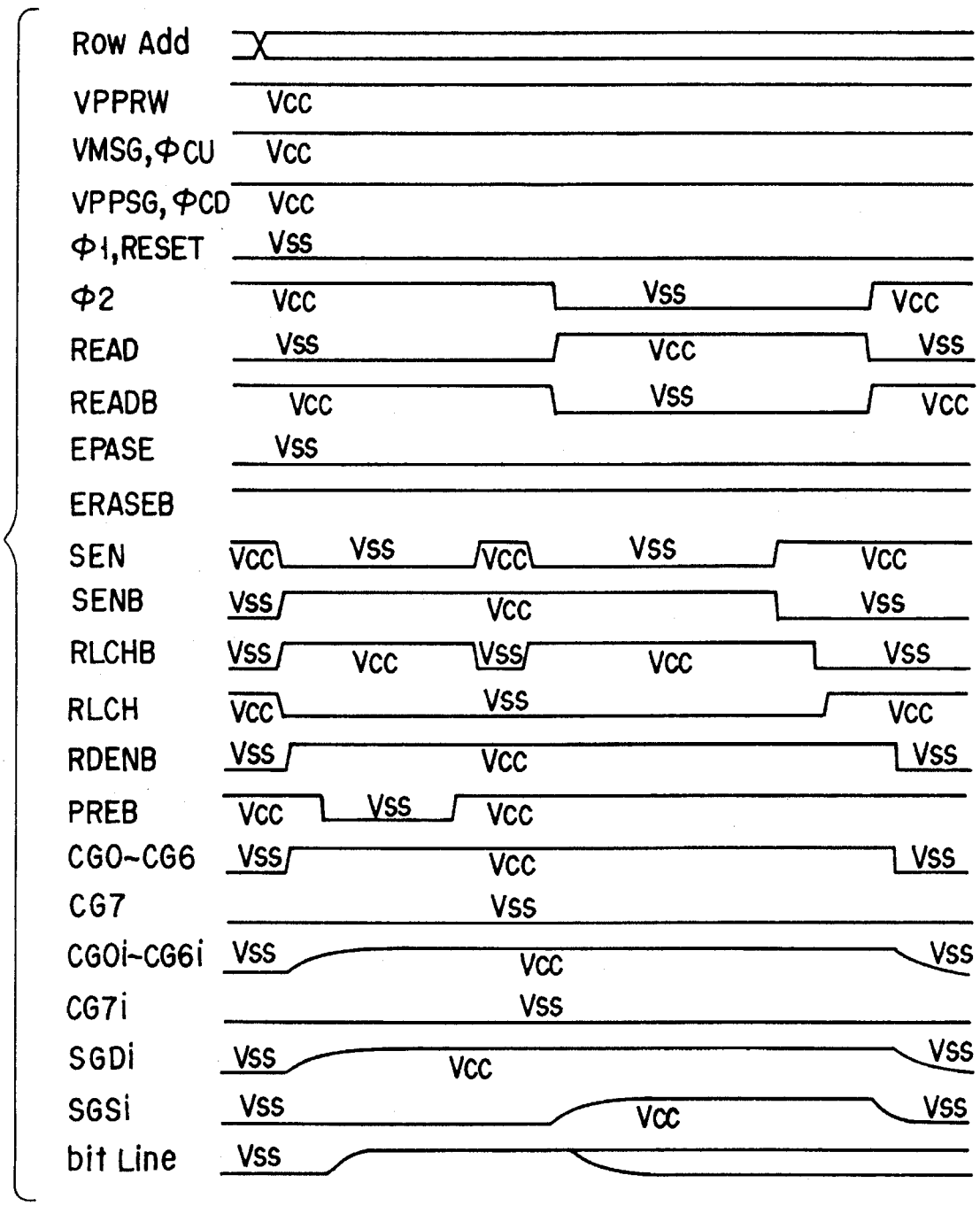
F I G. 27

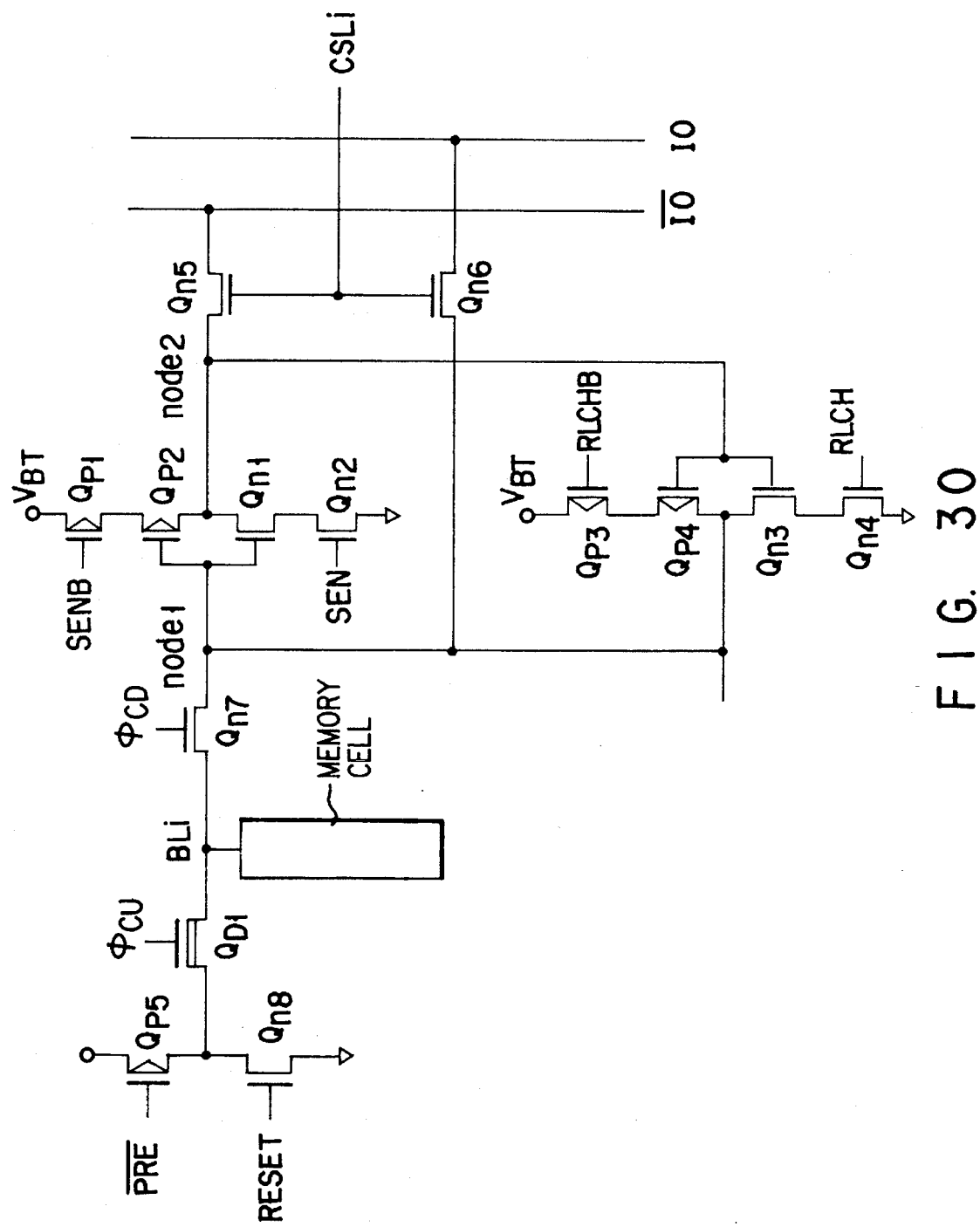
F I G. 30

NONVOLATILE SEMICONDUCTOR MEMORY APPARATUS

This application is a Division of application Ser. No. 07/950,147, filed on Sep. 24, 1992, now abandoned.

BACKGROUND OF THE INVENTION

1. Field of the Invention

The present invention relates to an electrically rewritable nonvolatile semiconductor memory (EEPROM) and, more particularly, to an EEPROM having a memory cell array of a NAND cell construction.

2. Description of the Related Art

A highly integrated NAND cell type EEPROM is known as one type of EEPROM. The NAND cell type EEPROM is constituted by connecting a plurality of memory cells each formed by connecting a source of one memory cell in series with a drain of a memory cell adjacent to the memory cell for a shared use, as one unit, to a bit line. This memory cell normally has an FETMOS in such a charge storage layer and a control gate are laminated. A memory cell array is integrally formed in a p-type substrate or a p-type well formed on an n-type substrate. A drain side of the NAND cell is connected to a bit line through a selective gate, and a source side is connected to a source line (reference potential wiring) through a selective gate. A control gate of the memory cell is continuously connected to a memory cell of a row direction of the memory cell array to become a word line.

The operation of the above NAND cell type EEPROM will be as described below.

A data writing operation is conducted sequentially from a memory cell of a position most separate from the bit line. A high voltage Vpp (=about 20 V) is applied to the control gate of the memory cell selected to write data, and an intermediate voltage VppM (=about 10 V) is applied to the control gate at the drain side and the selective gate of the memory cell disposed at the bit line side from this memory cell. 0 V or an intermediate voltage is applied to the bit line in response to data. When 0 V is applied to the bit line, the potential of 0 V is transmitted to the drain of the selected memory cell, and thus electrons are injected from the drain to a floating gate. The threshold value of the memory cell selected is shifted in a positive direction by the electron injection. This state is set, for example, to data "0". When an intermediate voltage is applied to the bit line, an electron injection does not occur, and hence the threshold value of the memory cell is not varied, and remains negative. This state is data "1".

Erasing of data is conducted simultaneously for all memory cells in the NAND cell. More specifically, all the control gates are set to 0 V, the bit line and the source line are set to floating states, and a high voltage of 20 V is applied to the p-type well and the n-type substrate. Thus, the electrons of the floating gates of all the memory cells are emitted to the p-type well, and the threshold values of the memory cells are shifted in a negative direction.

Data reading operation is conducted by setting the potential of the control gate of the selected memory cell to 0 V, setting the potentials of the control gates and the selective gates of the memory cells except the selected memory cell to a power source potential Vcc (=5 V), and detecting whether or not a current flows in the selected memory cell.

As apparent from the above description of the operation, the nonselective memory cell is operated as a transfer gate at the times of writing and reading in the NAND cell type EEPROM. From this point of view, the threshold voltage of the written memory cell is limited. For example, a preferable range of the threshold value of the memory cell in which "0" is written becomes about 0.5 to 3.0 V. The threshold value distribution after the data is written in the memory cell is required to be smaller than this range by considering aging change after the data are written, an irregularity in manufacturing parameter of the memory cell, and an irregularity in the potential of the power source.

In order to satisfy the above-described requirements, heretofore, verifying operations of writing of data and a writing state are conducted by the following method. FIG. 1 shows the verifying operation of the writing of data and the writing state.

FIG. 1 shows a data writing basic algorithm for one page in a case where 512 memory cells (i.e., column addresses 0 to 511) along one control gate line (word line) are for one page, a unit writing time is set to 40 μsec, and data writing and verifying operations are repeated in a page mode.

First, N indicating data writing count is set to N=1, and an address in a page is set to "0" (in step S1). A write mode is set (in step S2). Data for one page are set (in step S3). Then, the data for one page are written with a write pulse of 40 μsec (in step S4).

When writing of the memory cell is ended, a write verify mode is set (in step S5). The data in one page are sequentially read (in step S6), and whether or not the writing state is sufficient is verified (in step S7). If the writing state is not sufficient, whether or not N>100 is determined (in step S8). If NO, the N is stepped up (in step S9). The address in the page is reset to "0" (in step S10). Then, the data writing (in steps S2, S3 and S4) and the verifying (in steps S5 and S6) operations are again repeated. In this manner, one writing time is shortened to repeat the writing and verifying operations step by step.

In the verifying operation, when sufficient data writing state is verified, whether or not the address in the page is arrived at 511 is judged (in step S11). If NO, the read address is stepped up (in step S12), and a read verifying operation is similarly repeated for next address.

The above-described operation is repeated and, when it is verified that data writings of all 512 memory cells for one page are sufficient (in step S11), a read verify mode is released (in step S13), and data writing for one page is ended.

If data writing is not ended even if data writings are repeated 100 times (in step S8), it is regarded as being any malfunction in the memory cell, the read verify mode is released (in step S14), and the writing is ended.

In the above-described verifying system, the memory cell which is most difficult to be written is noted, and the writing operation is repeated until the memory is sufficiently written. Therefore, unnecessary writing operation is repeated for the memory cell which has been sufficiently written. For example, when the case where the threshold value of a certain memory cell is written to 0.5 V will be considered, it is ideal to hold this state, but if there is a memory cell which is not sufficiently written, the writing operation is repeated until the memory cell is sufficiently written. As a result, the threshold value of the memory cell which has been already sufficiently written is unnecessarily raised.

As described above, since the memory cell which is most difficult to be written is repeatedly written in the conventional EEPROM, unnecessary rise of the threshold value of the memory cell which is easily written is caused. If the threshold value is raised, when the memory cell is operated as a transfer gate upon reading of the memory, a difference between the potential (Vcc) of a nonselective word line and the threshold value is reduced. As a result, there arises a problem in which the current of the cell at the time of reading is reduced and an accessing time is resultantly increased.

There is as another problem of the NAND cell type EEPROM insufficient high speed performance of a sense amplifier.

Heretofore, a sense amplifier of a NAND cell type EEPROM which has a data latching function using two signal synchronization type inverters, is known. In such a sense amplifier using such inverters, it is necessary to discharge a bit line to the threshold value of a circuit in the case of sensing data, and hence it cannot sense the data at a high speed. In order to perform a high speed sensing operation, it is considered to apply a differential sense amplifier using a flip-flop used in a DRAM.

However, there is still another problem as below in this case. In the NAND cell type EEPROM, a cell current flows if a selective memory cell has a negative threshold value, and the potential of the bit line decreases. On the contrary, no cell current flows if the memory cell has a positive threshold value. As described above, since the potential of the bit line remains at the precharged level, when data is read after a pair of bit lines are connected to the sense amplifier to be precharged at the same potential similarly to the operation of the DRAM, the potential of the bit lines becomes lower than or the same as the reference potential. Therefore, even if a sense amplifier of the DRAM is used for the bit lines held at the precharged level as it is, the data cannot be read.

As described above, the sense amplifier using the inverter of the conventional EEPROM is difficult to sense at a high speed, and even if a flip-flop type sense amplifier such as in the DRAM is employed, the sense amplifier cannot sense as it is.

Further, as described above, in the NAND cell type EEPROM, it is necessary to charge its control gate, since the nonselective memory cell is used as a transfer gate, for example, to Vcc at the time of reading data. In this case, since a number of memory cells are connected to the control gate as a word line, its load capacity is very large, and its rising or falling time occupies a large fraction of its accessing time. Accordingly, it has a problem that a high speed accessing is difficult in the NAND cell type EEPROM.

In the case of reading data, charging of the control gate of the nonselective memory cell will be described in detail.

In the case of reading data, after a bit line is first charged to Vcc, the control gate of the nonselective memory cell of the selected NAND cell block and the selected gate of the source and drain sides are charged from the state of Vss to Vcc simultaneously. The control gate of the selected memory cell is controlled to be charged to the value Vss in the circuit, but originally is fixed to the value Vss.

If the threshold value of the selected memory cell is negative in the above-described state, a cell current flows, and the potential of the bit line is discharged to the value Vss. If the threshold value of the selected memory cell is positive, no cell current flows, and the potential of the bit line is held at an "H" level. The potential of the bit line is sensed by the sense amplifier.

In the NAND cell type EEPROM, it is necessary to set, after writing, the threshold value of the memory cell to the value Vcc or less, and the distribution of the threshold value of the memory cell is normally checked after the memory cell is written in a test mode. In this case, a positive voltage (e.g., 1 V, 2 V) is applied to the control gate of the selected memory cell, whether or not the cell current is flowing is detected and the distribution of the threshold value is introduced. In this case, the circuit is operated simultaneously with the normal reading mode.

Further, heretofore, it has been difficult to measure in detail the distribution of the threshold value of the memory cell at the erasing side. However, a method of obtaining the distribution of the threshold value by applying a negative voltage to the control gate of the selected memory cell is gaining importance from the standpoint of a reliability test, etc.

As described above, charging and discharging of the control gate, the selective gates at the source and drain sides are conducted at the same timing as in the conventional reading mode. Here, the case where a negative voltage is applied to the selected control gate, the distribution of the negative threshold value is measured or erase verifying reading operation is conducted, will be considered.

For example, the case where whether or not the threshold value of the memory cell is −2 V or less is checked, will be described as an example.

In this case, −2 V is applied to the control gate of a selected memory, Vcc is applied to the control gate of the nonselective memory cell, and whether or not cell currents flow in the respective cell will be checked. At this time, the control gate of the selective memory cell is charged from Vss to −2 V, but in the case of the NAND cell type EEPROM, many memory cells are connected to one control gate, and its rise takes a time of μsec order.

Therefore, if the selective memory cell has a threshold value of about −1 V, the selective memory cell is turned ON for a while at the stage of shifting the control gate of the selective memory cell from Vss to −2 V, and the selective memory cell is turned OFF after the stage in which the control gate of the selective memory becomes −1 V or less.

At this time, since the selective gate is charged to the value Vcc simultaneously with the control gate of the selective memory cell, a cell current flows and the potential of the bit line is discharged while the control gate is shifted from the value Vss to −1 V.

Therefore, it cannot check whether or not the cell current flows at the stage in which the control gate of the selective memory cell is charged to −2 V.

Accordingly, there is a problem in the conventional method for simultaneously charging the control gate of the selective memory cell and the selective gate that, if the negative voltage is applied to the control gate of the selective memory cell to check the threshold value of the memory cell, the cell current already flows before the control gate of the selective memory cell is charged to a testing voltage, and an accurate detection cannot be performed.

SUMMARY OF THE INVENTION

It is an object of the present invention to provide an EEPROM wherein, in memory cells for writing (injecting electrons) "0" in one page by a verifying operation of each bit, a verify control operation is performed for rewriting data to the memory cell which is insufficiently injected, but inhibiting the charge-injecting into the memory cell when the cell is sufficiently written is performed.

It is another object of the present invention to provide an EEPROM wherein a flip-flop type sense amplifier can be used to read data.

It is still another object of the present invention to provide an EEPROM wherein a high speed accessing is performed, and a threshold value at the time of erasing a memory cell can be accurately detected.

The EEPROM according to a first aspect of the present invention has a feature to verify to rewrite data latched by verifying to read a memory cell writing "0" without destroying. More specifically, if a memory cell group for one page contains a memory cell which is insufficiently written, means are provided for controlling data of said sense amplifier and data latch circuit with data latched by read verifying data at the time of additionally writing to a bit line to be written and with data latched by read verifying data at the time of additionally writing by inverting the data to a bit line to be held in an erasing state.

According to the first aspect of the present invention, the verify read data of the memory cell writing "0" is not destroyed, but further injecting is prevented by again injecting the memory cell which is insufficiently injected by next rewriting and applying an intermediate potential to the bit line of the memory cell which is sufficiently injected, and a verifying operation for each bit is performed.

A method for reading, after data is written, comparing the data with set data in an external control circuit, altering data from "0" to "1" for the cell which is sufficiently written, again setting data in this cell, and rewriting it, is considered. However, this method has a significant problem that the method applies a large load to the external control circuit, and generates necessity of comparing all data for one page at each verifying procedure to increase writing time. According to the present invention, each bit can be verified without altering data to be applied from the external control circuit.

As described above, according to the first aspect of the present invention, the verifying operation of each bit is conducted to eliminate conventional excessive writing, to improve reliability and to obtain an EEPROM which realizes a high speed performance.

The EEPROM of a second aspect of the present invention comprises a data latch and sense amplifier having CMOS flip-flops including different current driving capacities between two NMOS transistors for constituting an NMOS flip-flop and between two PMOS transistors for constituting a PMOS flip-flop in such a manner that the NMOS flip-flop and the PMOS flip-flop are activated at different timings by reading address.

According to the second aspect of the present invention, the flip-flop type sense amplifier having the transistor pair including different current driving capacities becomes equivalent to the application of a potential difference to two nodes of the flip-flop using transistors having equal current driving capacity. Accordingly, the flip-flop can be operated in a desired stable state even if the reference potential is equal to the sense potential. In this case, data can be detected without error by differentiating activating timings of the NMOS flip-flop and that of the PMOS flip-flop corresponding to the reading address, and previously activating one in response to whether or not data of any side of the two nodes is sensed.

According to the second aspect of the present invention, there is provided an EEPROM which realizes a high speed sensing operation by using a flip-flop type sense amplifier.

A third aspect of the present invention has a feature that charging of a control gate of a nonselective memory cell is conducted simultaneously upon charging of a bit line. More specifically, charging of the control gate of the nonselective memory cell is conducted preferentially to that of at least one of a selective gate of source and drain sides in normal reading and so on (i.e., random access). Then, the feature resides in that, if the threshold value at the time of erasing the memory cell is judged, charging of the selective gate is started by delaying from the timing for charging the control gate of the selective memory cell in a reading mode. That is, the selective gate is closed until the control gate is completely set to a negative testing voltage to prevent the bit line from being discharged. After the control gate is completely set to the negative testing voltage, charging of the selective gate is delayed so as to turn ON the selective gate.

According to the third aspect of the present invention, charging of the control gate of the nonselective memory cell is simultaneously conducted with that of the bit line. Accordingly, the memory cell can be accessed at a high speed. Further, since the selective gate is closed at the stage in which the control gate of the nonselective memory cell is charged from Vss to the negative voltage, the potential of the bit line is not discharged. Since the selective gate is turned ON after the control gate is completely set to the negative testing voltage, the threshold value can be accurately judged.

Therefore, according to the third aspect of the present invention, high speed accessing of the NAND cell type EEPROM is performed, and the distribution of the threshold value at the time of erasing the NAND cell type EEPROM can be accurately measured.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a view showing an example of a construction of a NAND cell type EEPROM system according to one embodiment of the present invention;

FIG. 3A and FIG. 3B are a perspective view and a plan view of the case where the system of FIG. 2 is applied to an LSI memory card;

FIG. 6A and FIG. 6B are sectional views taken along the lines 6A—6A and 6B—6B of FIG. 5A;

FIG. 7 is an equivalent circuit diagram Of d memory cell array of the EEPROM;

FIG. 11 is a view showing a data control circuit at the time of verifying data input/output buffer of FIG. 4;

FIG. 13 is a view showing data input waveform at the time of verifying of the embodiment;

FIG. 15 is a view showing a circuit for determining a pulse width;

FIG. 19 is a timing chart of the case where a memory cell of left side of FIG. 18 is read;

FIG. 27 is a timing chart of accessing according to the embodiment;

FIG. 30 is a view showing a modified example of a bit line control circuit of FIG. 10;

DETAILED DESCRIPTION OF THE PREFERRED EMBODIMENTS

Figure 1:
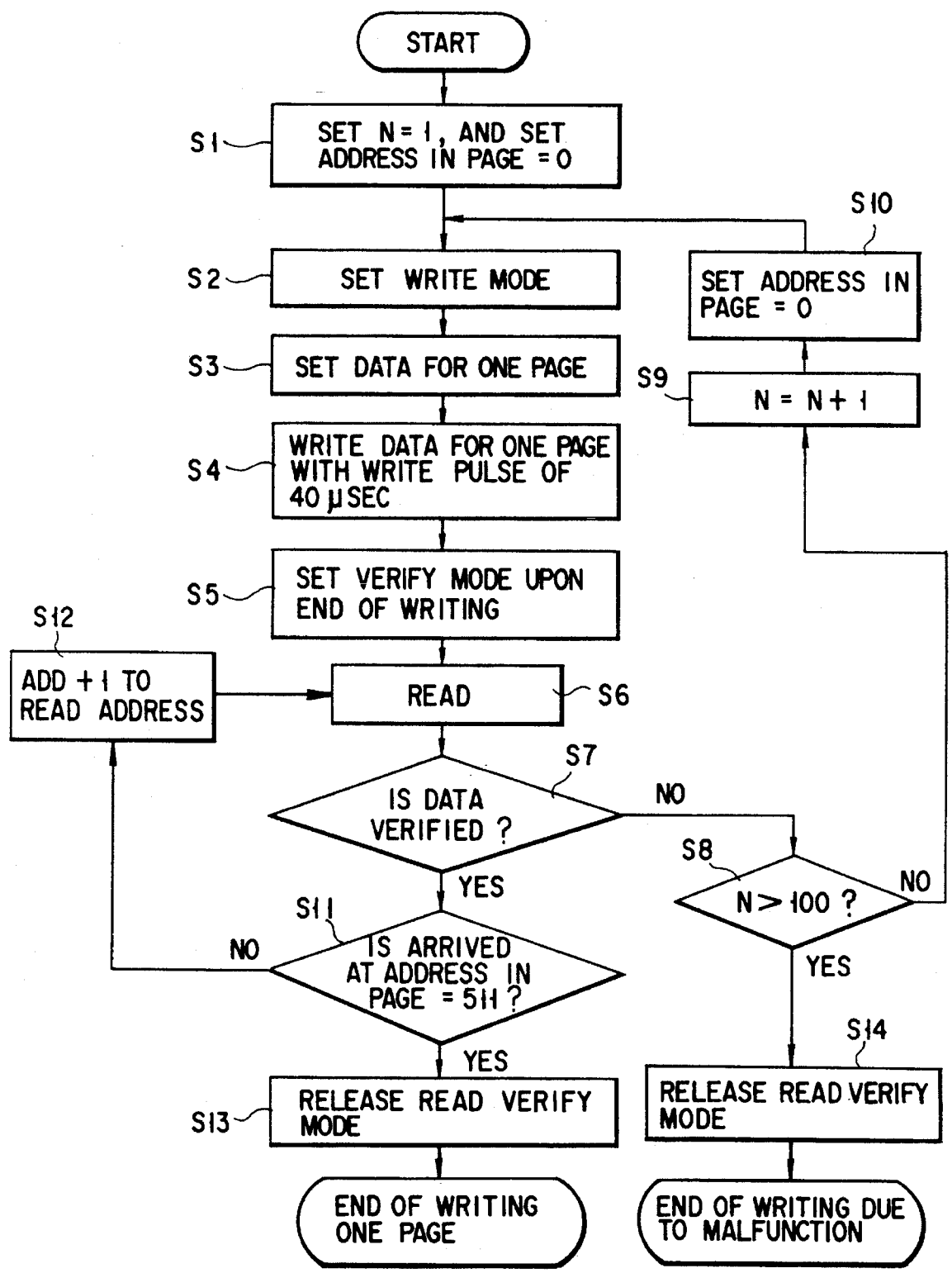
FIG. 1 is a view showing an algorithm of a conventional verifying operation.

An embodiment of the present invention will be described below with reference to the accompanying drawings.

FIG. 2 shows an example of a construction of a NAND cell type EEPROM system according to an embodiment of the present invention. A plurality of NAND cell type EEPROM chips 1 are rewritten by a control circuit LSI chip 2 for controlling according to an algorithm to be described in detail later.

FIG. 3A and FIG. 3B respectively show a perspective view and a plan view of the case where the system of FIG. 2 is applied to an LSI memory card. This LSI memory card places 4 EEPROM chips 1 and one control circuit LSI chip 2 on a card body 3 to transmit and receive signals to and from an exterior via external terminals 4.

Figure 4:
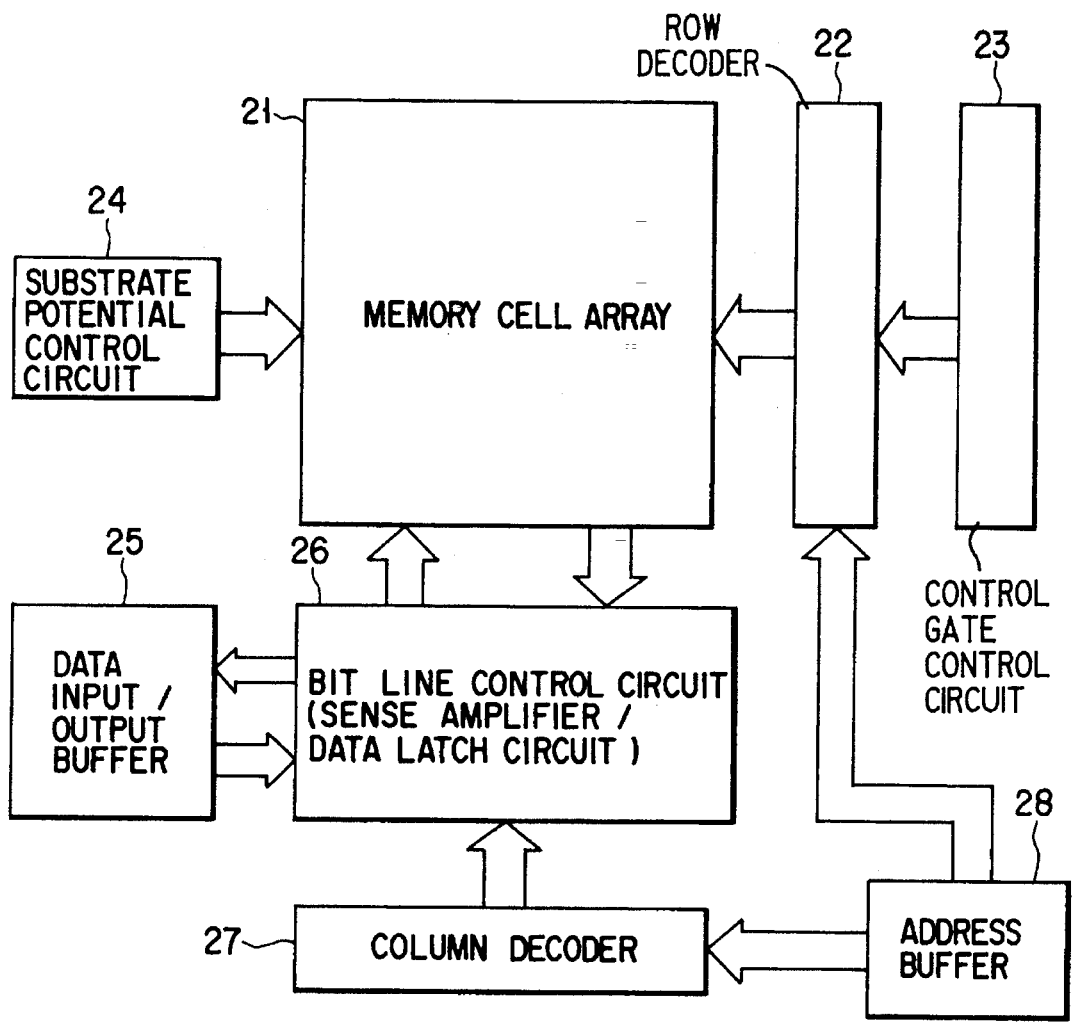
FIG. 4 is a view showing an example of a construction of the NAND cell type EEPROM of FIG. 2.

FIG. 4 shows an example of a construction of the NAND cell type EEPROM of FIG. 2.

According to FIG. 4, the EEPROM comprises a memory cell array 21, and a bit line control circuit 26 for writing and reading data in the memory cell array 21. The bit line control circuit 26 is connected to a data input/output buffer 25. A control gate control circuit 23 outputs a predetermined control signal corresponding to operations of writing, erasing, reading and verifying data to a control gate line selected by a row decoder 22 of the memory cell array 21. A substrate potential control circuit 24 controls a p-type well formed of cells to 0 V at the normal time or to Vpp (about 20 V) at the time of erasing. Input address information is transmitted through an address buffer 28 to the row decoder 22 and a column decoder 27.

Figures 5A, 5B:
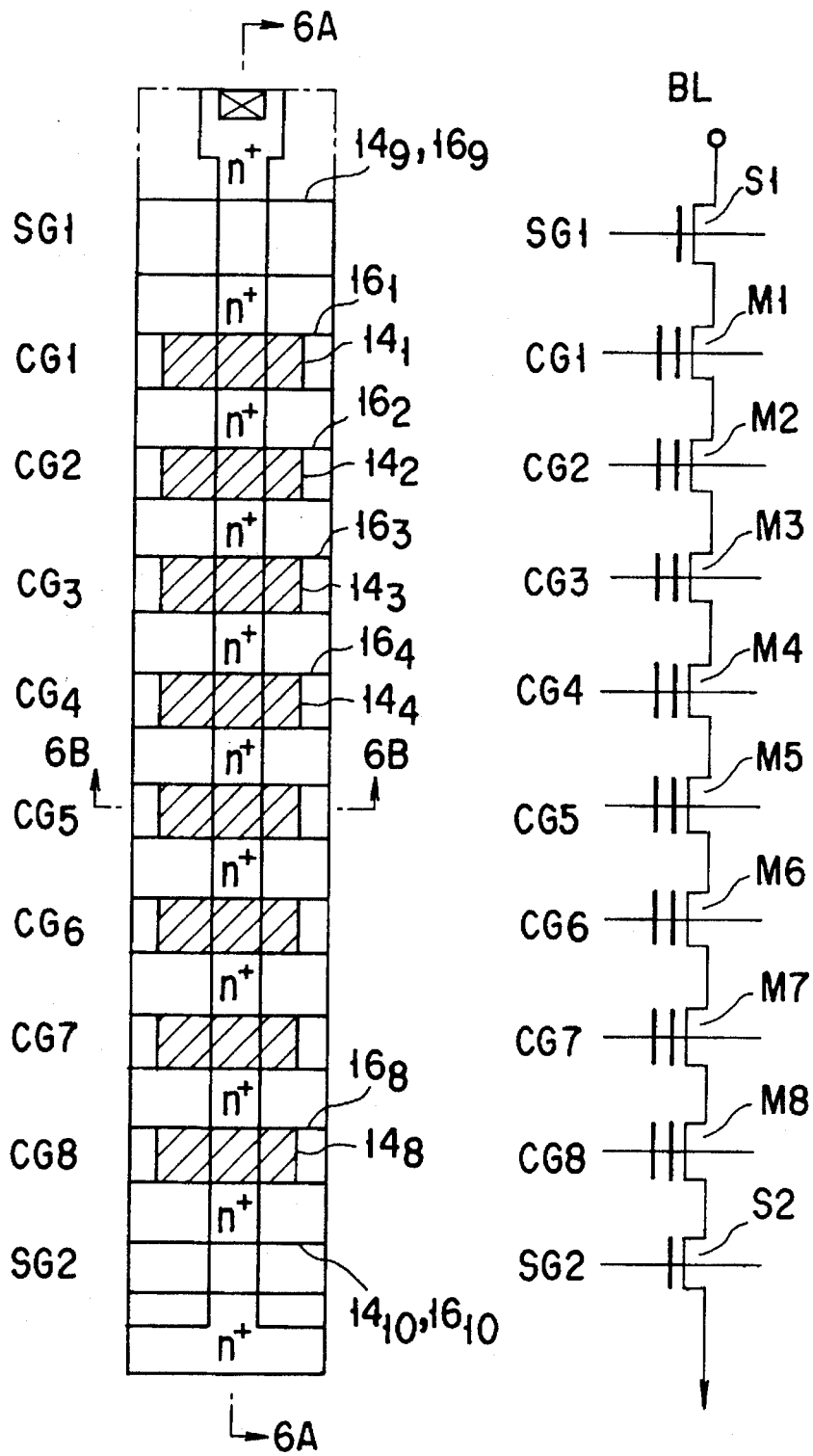
FIG. 5A and FIG. 5B are a plan view and an equivalent circuit diagram of one NAND cells of a memory cell of FIG. 4.

FIG. 5A and FIG. 5B are respectively a plan view and an equivalent circuit diagram of one NAND cell of the memory cell array 21 of FIG. 4. FIG. 6A and FIG. 6B are respectively sectional views taken along the lines 6A—6A and 6B—6B of FIG. 5A.

A memory cell array having a plurality of NAND cells is formed on a p-type silicon substrate (or p-type well) 11 surrounded by an element isolating oxide film 12. One NAND cell will be described.

In this embodiment, eight memory cells $M_1$ to $M_8$ are connected in series to constitute one NAND cell. In the memory cell, floating gates 14 ($14_1$, $14_2$, ... , $14_8$) are formed on the substrate 11 through a gate connecting film 13, and control gates 16 ($16_1$, $16_2$, ... , $16_8$) are formed thereon through an interlayer insulating film 15. n-type diffused layers 19 of source and drain of the memory cell are connected in series in a shape for a shared use of the source and the drain of the adjacent memory cells. Selective gates $14_9$ and $16_9$, $14_{10}$ and $16_{10}$ formed simultaneously with the floating gates and the control gates of the memory cell are respectively provided at the drain and source sides of the NAND cell.

The substrate formed with the elements as described above is covered with a CVD oxide film 17, and bit lines 18 are arranged thereon. The bit lines 18 are contacted with the drain side diffused layers of one end of the NAND cell.

The control gates 16 of the NAND cells aligned in the row direction of the memory cell are arranged as common control gate lines $CG_1$, $CG_2$, ... , $CG_8$ of the memory cells of the row direction. These control gate lines become word lines. These selective gates $14_9$, $16_9$, and $14_{10}$, $16_{10}$ are also arranged as common selective gate lines $SG_1$, $SG_2$ of the selective gate of the row direction.

FIG. 7 shows an equivalent circuit of the memory cell array in which the NAND cells constituted as described above are arranged in a matrix state.

Figure 8:
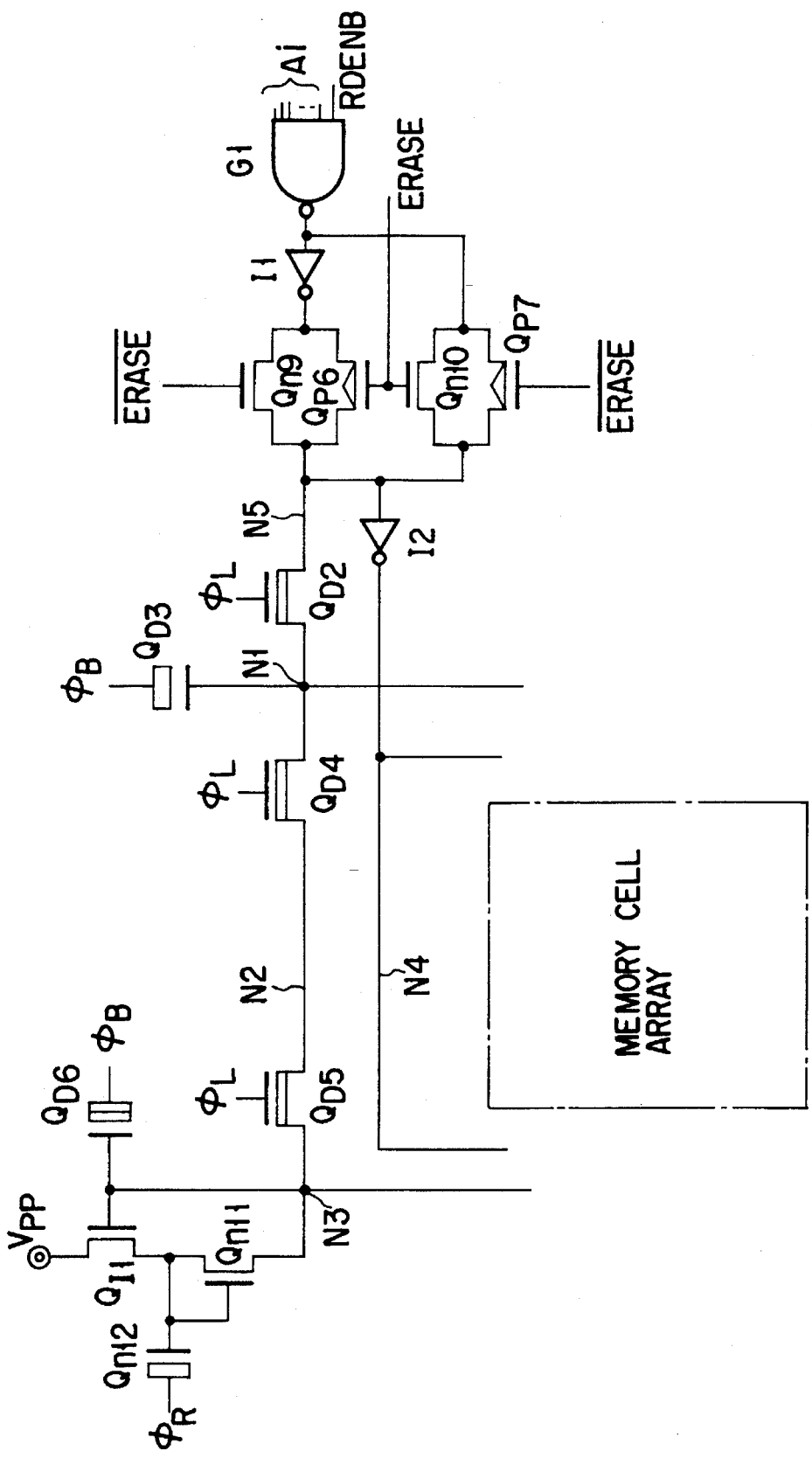
FIG. 8 and FIG. 9 are views showing an example of a construction of a row decoder of FIG. 4.
Figure 9:
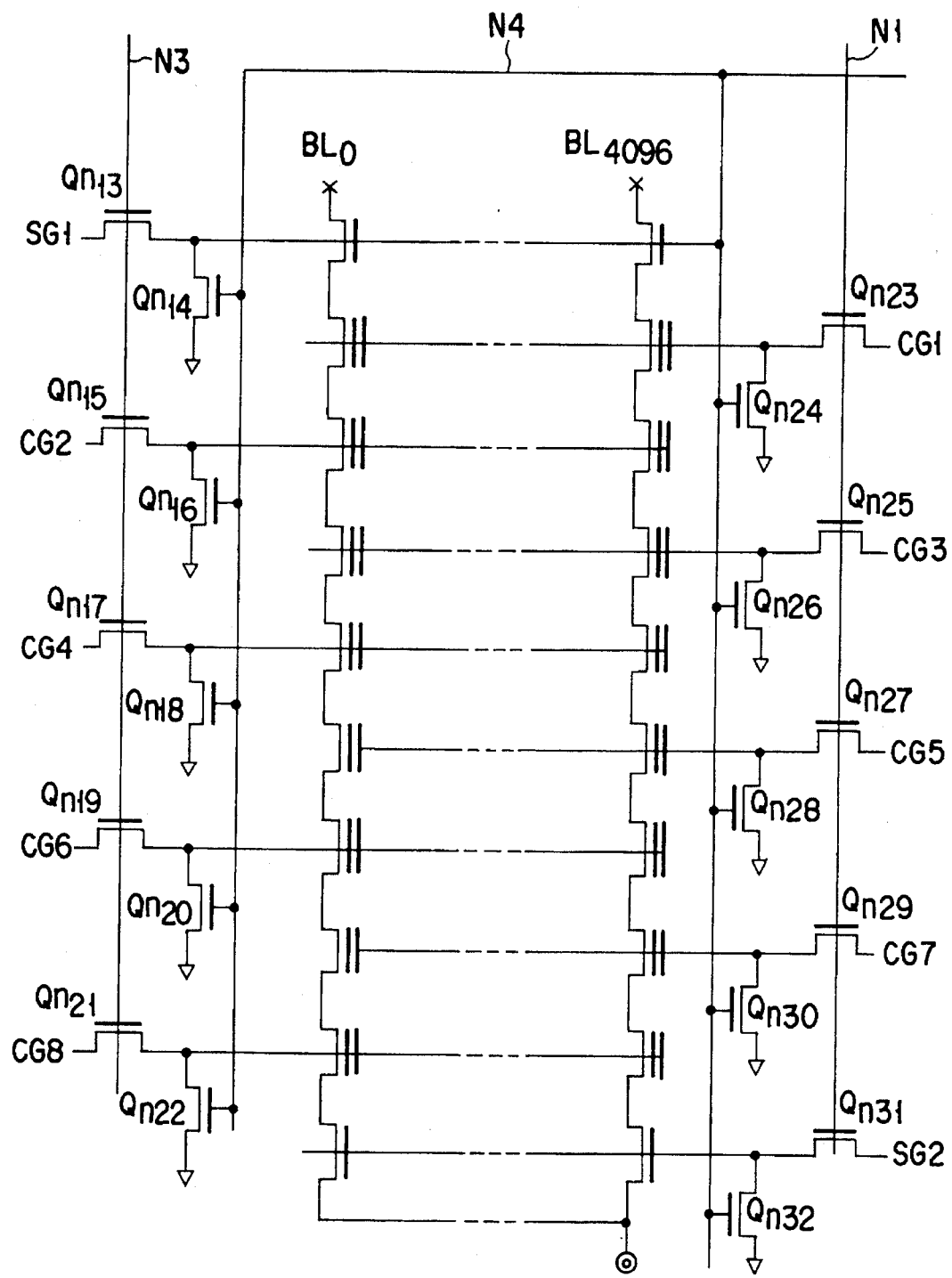

FIG. 8 and FIG. 9 show examples of constructions of the row decoder 22 of FIG. 4. In FIG. 8, one NAND cell block is selected by an address Ai and an enable signal RDENB via the NAND gate $G_1$. One of the outputs of the gates $G_1$ are connected to a node $N_1$ through an inverter $I_1$ and a transfer gate made of an E type n-channel MOS transistor Qn9 and an E type p-channel MOS transistor Qp6. The other one of the gate $G_1$ is connected to the node $N_1$ through a transfer gate made of an E type n-channel MOS transistor Qn10 and an E type p-channel MOS transistor Qp7 without an inverter. These transfer routes are selected by a control signal ERASE, \ERASE in response to the case of reading, writing.

D type n-channel MOS transistors $Q_{D3}$, $Q_{D6}$ are transistors for boosting the nodes $N_1$, $N_3$. An I type n-channel MOS transistor $Q_{I1}$, E type n-channel MOS transistors Qn11 and Qn12 constitute a pump circuit for transferring a high potential Vpp to the node $N_3$. D type n-channel MOS transistors $Q_{D2}$, $Q_{D4}$, $Q_{D5}$ are transistors for electrically isolating the node $N_5$ from the $N_1$, the node $N_1$ from the node $N_2$, the node $N_2$ from the node $N_3$, respectively.

In FIG. 9, E type n-channel MOS transistors Qn14, Qn16, Qn18, Qn20, Qn22, Qn24, Qn26, Qn28, Qn30 and Qn32 are transistors for selectively grounding the selective gates and the control gates. E type n-channel MOS transistors Qn13, Qn15, Qn17, Qn19, Qn21, Qn23, Qn25, Qn27, Qn29 and Qn31 selectively transfer the output of the control gate control circuit 23 of FIG. 4 to the selective gates $SG_1$, $SG_2$ the control gates $CG_1$ to $CG_8$.

The operation of the row decoder 22 of FIG. 8 and FIG. 9 in the respective modes will be described below.

At the time of reading data, the erasing signal ERASE is set to an "L", and the \ERASE is set to an "H". If the address signal Ai and the enable signal RDENB are selected as an "H", the nodes $N_5$, $N_1$, $N_2$ and $N_3$ become Vcc, and the node $N_4$ becomes 0 V. At this time, a clock $\phi_L$ becomes an "H". Then, when the clock $\phi_L$ becomes the "L" and the clock $\phi_B$ becomes the "H", the nodes $N_1$ and $N_3$ become a potential higher than the power source potential Vcc (Vcc+Vth), and a desired read voltage is output to the selective gates $SG_1$, $SG_2$ and the control gates $CG_1$ to $CG_8$. For example, if the control gate $CG_2$ is selected, the $SG_1$, $SG_2$, $CG_1$ and the $CG_3$ to $CG_8$ become the Vcc, and the $CG_2$ becomes "0". In the case of verifying to read, the selected control gate $CG_2$ becomes 0.5 V.

In the case of writing data, the ERASE becomes the "L", and the \ERASE becomes the "H".

Accordingly, in the selected block similarly to the case of reading the nodes $N_1$, $N_2$, $N_3$, $N_5$ are Vcc, and the node $N_4$ is 0 V. Then, when the output $\phi_R$ of a ring oscillator is output, the nodes $N_1$, $N_2$, $N_3$, $N_5$ of the selected block become Vpp (about 20 V). Thereafter, the clock $\phi_L$ becomes the "L", the clock $\phi_B$ becomes the "H". The nodes $N_1$, $N_3$ become (Vpp+Vth), and a desired potential is output to the selective gates $SG_1$, $SG_2$, and the control gates $CG_1$ to $CG_8$. For example, if the control gate $CG_3$ is selected, the $SG_1$ becomes $V_M$ (about 10 V), the $CG_1$, $CG_2$ become $V_H$, the $CG_3$ become Vpp, the $CG_4$ to $CG_8$ become $V_M$, and the $SG_2$ becomes 0 V.

In the case of erasing data, erasing signal ERASE becomes "H", and the \ERASE becomes "L". Thus, the nodes $N_1$, $N_2$, $N_3$ and $N_5$ of the selected block become 0 V, the node $N_4$ becomes Vcc, the selective gates $SG_1$, $SG_2$ and the control gates $CG_1$ to $CG_8$ become 0 V. In the nonselective block, similarly to the case of writing, the nodes $N_1$, $N_3$ become (Vpp+Vth), and the selective gates $SG_1$, $SG_2$ and the control gates $CG_1$ to $CG_8$ become Vpp.

In the above-described operation, the potential Vwell to be applied to the p-type well formed with the cell is controlled by the output of the substrate potential control circuit 27 of FIG. 4. The p-type well potential Vwell becomes Vpp only at the time of erasing data by the output, and is held 0 V except this case.

Figure 10:
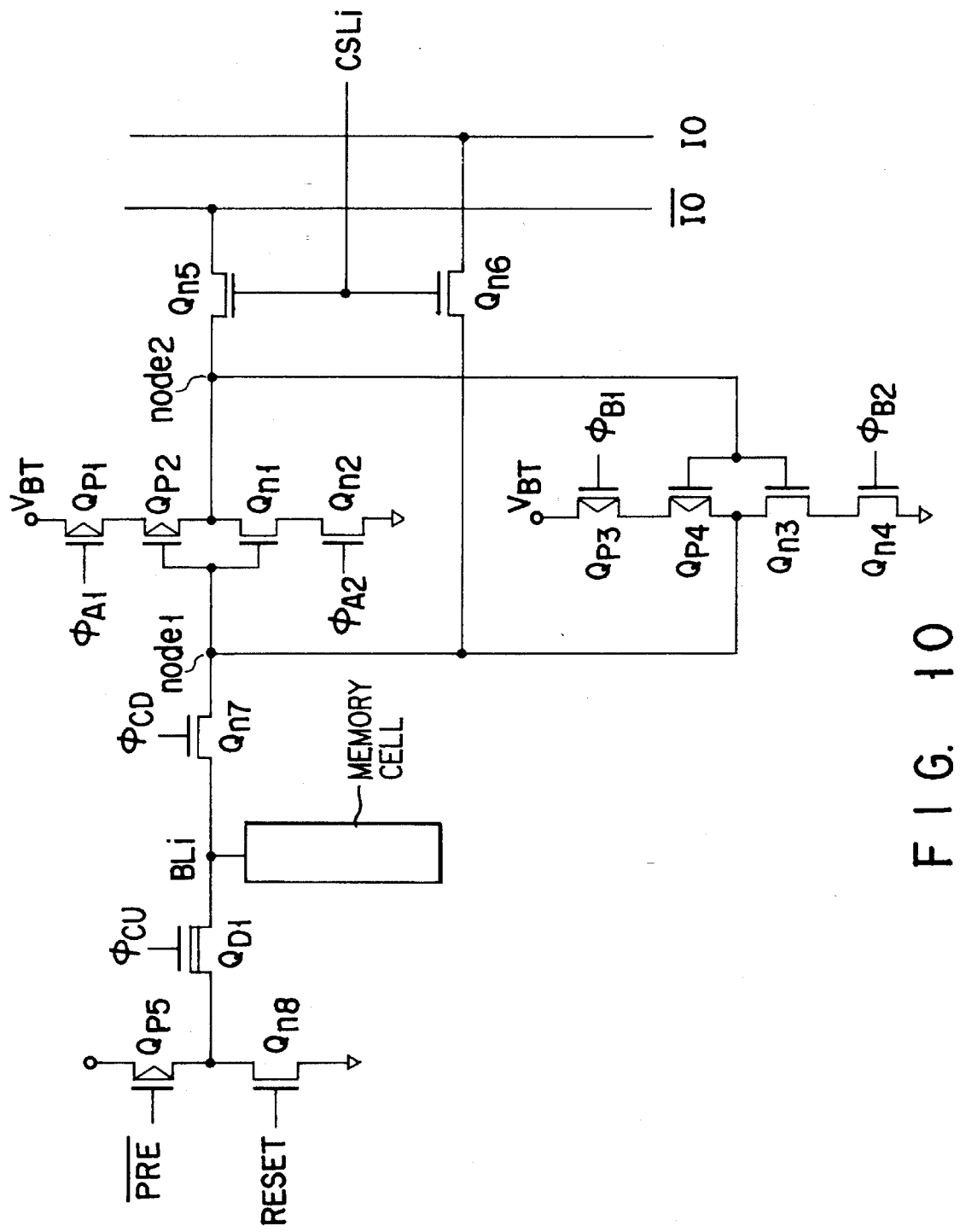
FIG. 10 is a view showing an example of a construction of a bit line control circuit of FIG. 4.

FIG. 10 shows an example of the bit line control circuit 26 of FIG. 4. The sense amplifier/data latch circuit has in combination a signal synchronization type inverter using E type p-channel MOS transistors Qp1, Qp2 and E type n-channel MOS transistors Qn1, Qn2, and a signal synchronization type inverter using E type p-channel MOS transistors Qp3, Qp4 and E type n-channel MOS transistors Qn3, Qn4.

The E type n-channel MOS transistors Qn5, Qn6 are turned ON, OFF by a column selection signal CSLi selected by an address, and transfer gates for controlling transfer of data between data input/output lines IO, \IO and this sense amplifier/data latch circuit.

If one address has an 8-bit configuration, the CSLi becomes a signal common for 8 bit lines.

The E type n-channel MOS transistor Qn7 is a transfer gate for controlling data transfer of the sense amplifier/data latch circuit and the bit line BLi. At the time of reading, a clock $\phi_{CD}$ becomes "H", at the time of writing the clock $\phi_{CD}$ becomes $V_M$ (about 10 V), and data is transferred by the MOS transistor Qn7.

The E type p-channel MOS transistor Qp5 is a bit line precharging transistor. When a control sign \PRE becomes "L", the MOS transistor Np5 becomes ON, and the bit line BLi is precharged to Vcc=5 V.

The E type n-channel MOS transistor Qn8 is a resetting transistor. When a control signal RESET becomes "H", the MOS transistor Qn8 becomes ON, and the bit line BLi is reset to a ground potential.

The D type n-channel MOS transistor $Q_{D1}$ is a transistor for inhibiting the application of a high potential to the transistors Qp5 and Qn8 at the time of erasing data where a high potential is applied to the memory cell. When a clock $\phi_{CU}$ is set to "L", the MOS transistor $Q_{D1}$ is turned OFF, and the high potential is not applied to the MOS transistors Qp5 and Qn8.

The operation by the modes of the control circuit of FIG. 10 will be described.

At the time of reading data, clocks $\phi_{A1}$, $\phi_{B1}$ become "H", clocks $\phi_{A2}$, $\phi_{B2}$ become "L", and the flip-flop is in a nonoperating state. At this time, a column selection signal CSLi becomes "L", the clock $\phi_{CD}$ becomes "H", the clock $\phi_{CU}$ becomes "H", the control signal \PRE becomes "H", the RESET becomes "L", and the $V_{BT}$ becomes Vcc. The control signal \PRE becomes "L", and the bit line BLi is precharged to Vcc. Then, when the control signal \PRE becomes "H", and the bit line BLi becomes a floating state, the word line is set to a predetermined potential, and data of the memory cell is read. The bit line BLi becomes "H" or "L" according to the read data.

When the $\phi_{A1}$ is set to "L" and the $\phi_{A2}$ is set to "H", the potential of the node node2 is established in response to the potential of the bit line. When the $\phi_{B1}$ is set to "L" and the $\phi_{B2}$ is set to "H", the data are latched. When the column selection signal CSLi is set to "H", the data are transferred to the input/output lines IO, \IO.

Figure 12:
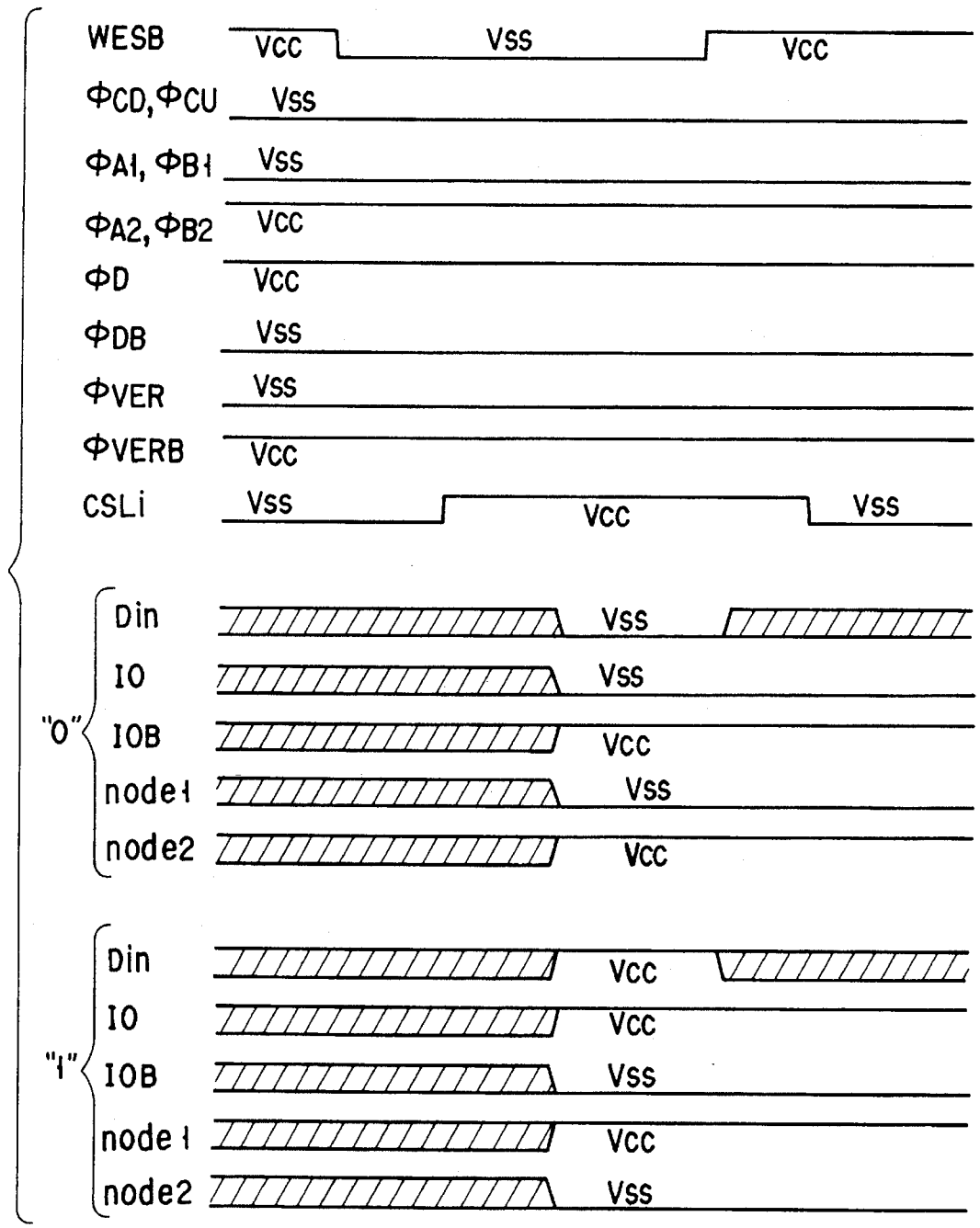
FIG. 12 is a view showing data input waveform at the time of non-verifying of the embodiment.

FIG. 11 shows an example of a construction of the data input/output buffer 25, and FIG. 12 shows data input waveforms at the time of non-verifying. The clock $\phi_{CD}$ of the bit line control circuit 26 of FIG. 10 becomes "L", and the bit line BLi and the sense amplifier are separated.

The Vss is output to the IO connected to the bit line of writing "0", and the Vcc is output to the IOB. The column selection signal CSLi is selected by an address signal, the node1 is connected to the IO, and the node2 is connected to IOB. Thus, the node1 becomes the Vss, and the node2 becomes the Vcc. The IO and the IOB are respectively held at the Vss and the Vcc until the column selection signal CSLi is closed, the node1 is latched to the Vss, and the node2 is latched to the Vcc. In the case of writing "1", similarly, the Vcc is output to the IO, and the Vss is output to the IOB. The node1 is latched to the Vcc, and the node2 is latched to the Vss.

When the data for one page are latched, the clock $\phi_{CD}$ becomes "H". The clock $\phi_{CD}$ and the $V_{BT}$ become an intermediate potential $V_M$ from the power source potential Vcc, and the potential of the bit line becomes 0 V from the $V_M$ by the data. When writing is ended, the $V_{BT}$ and the $\phi_{CD}$ become the Vcc, the $\phi_{A1}$ and the $\phi_{B1}$ become "H", the $\phi_{A2}$ and the $\phi_{B2}$ become "L", and the RESET becomes "H" to be reset.

Then, it is shifted to a verifying operation, and a reading operation is executed. 0.5 V is applied to a selective word line in the case of reading at the time of verifying. That is, if the threshold value of the selective memory cell is 0.5 V or more, it is regarded as a writing state "0", while if the threshold value is 0.5 V or less, it is regarded as an erasing state "1". Accordingly, in the case of verifying, the memory cell to become "0" is sufficiently electron injected, and "0" is read, the cell is OK. If the cell is not sufficiently electron injected and "1" is read, the cell is NG, and the cell is judged to again need writing.

The case of writing "0" will be considered.

If the memory cell is sufficiently electron injected and "0" is verified to be read, no cell current flows, Vcc is latched to the node1 of the sense amplifier after reading, and Vss is latched to the node2. Since this cell is not required to be again written, in the case of verifying to rewrite, Vcc may be latched to the node1, and Vss may be latched to the node2. That is, it is convenient to enter a rewriting mode while holding the latched data after reading.

If the memory cell is insufficiently electron injected and "1" is verified to be read, a cell current flows, and, after reading, Vss is latched to the node1 of the sense amplifier, and Vcc is latched to the node2. Since this cell is required to be again written, in the case of verifying to rewrite, Vss may be latched to the node1, and Vcc may be latched to the node2. That is, even in this case, it is convenient to enter a rewriting mode while holding latched data after reading.

As described above, in the case of verifying the cell in which "0" is written, verifying of each bit is performed by applying an intermediate potential to the bit line of the cell which is sufficiently electron injected if next rewriting mode is entered while holding the data latched in the case of verifying to read to prevent unnecessary electron injecting, applying Vss to the bit line of the cell which is insufficiently electron injected and electron reinjecting the cell.

The case of writing "1" will be considered.

In this case, the memory cell is not electron injected, but retained in an erasing state, and its threshold value is negative. In this case, Vss is latched to the node1 of the sense amplifier after verifying to read, and Vcc is latched to the node2. In order that this cell is not injected even in a rewriting mode, it is necessary to latch Vcc to the node1 and to latch Vss to the node2. That is, in the case of writing "0", it is, in contrast, necessary to invert the latched data.

In summary, the data latched in the read verifying to is used in the memory cell in which "0" is written, and the data latched in the read verifying operation may be inverted for the memory cell in which "1" is written. That is, in the case of rewriting, if the data transferred from an external control circuit is "0", the latched data remains held, while if the data is "1", the latched data is inverted. Then, verifying of each bit is performed without varying the data from the external control circuit.

An exemplified verifying control operation for performing the above-described condition will be described below.

When a verifying mode is started, a verify control signal $\phi_{VER}$ is latched to "H", and the "H" is held until the verifying operation is completed. A waveform diagram of transferring the data at the time of the verifying more is shown in FIG. 13.

In the state that the control signal $\phi_{VER}$ is "H", the IO is fixed to Vcc. In this state, when a write control signal WESB is shifted to "L", in the circuit of FIG. 11, the IOB is similarly fixed to the Vcc. Thereafter, a column selection signal CSLi becomes the Vcc.

Then, when the control signal WESB is shifted to "H", data is established. In the case of writing "0", the IOB is held to Vss by the control circuit of FIG. 11. In the case of writing "1", the IOB is inverted from the Vcc to the Vss by the circuit of FIG. 11. Then, the column selection signal CSLi becomes the Vss.

Three cases will be described with reference to FIG. 13 where the memory cell is sufficiently electron injected by writing "0" under the above-described condition, the case where the cell is insufficiently injected by writing "0", and the case where the cell is written with "1".

In FIG. 13, if the memory cell is sufficiently electron injected, Vcc is latched to the node1 by read verifying, and Vss is latched to the node2. When a column selection signal CSLi becomes Vcc, the Vcc is output to both the IO and IOB. At this time, a current flows from the IOB through the column transistors Qn5, the node2, and the transistors Qn1, Qn2 of the clock signal synchronization type inverter, and the potential of the node2 is raised, but since the transistor Qn5 is operated as a pentode and a voltage drop here is large, the potential rise of the node2 is suppressed to 1 V or less. Accordingly, the latched data is not destroyed. Then, the control signal WESB is shifted to "H", but the IO and the IOB are not varied, and held at Vcc. Thereafter, when the column selection signal CSLi becomes Vss, the node1 is latched to Vcc, the node2 is latched to Vss, and the cell is returned to the latched state directly after the read verifying.

In the case of writing "0" of FIG. 13, the operation of insufficiently electron injecting the cell is as below. In this case, Vss is latched to the node1, and Vcc is latched to the node2 by read verifying. When the column selection signal CSLi becomes the Vcc, the Vcc is output to both the IO and the IOB. At this time, a current flows from the IO through the column gate transistor Qn6, the node1, and the transistors Qn3, Qn4 of the clock signal synchronization type inverter, and the potential of the node1 is raised, but since the transistor Qn6 is operated as a pentode and the voltage drop here is large, the potential rise of the node1 can be suppressed to 1 V or less. Accordingly, the latched data is not destroyed. Then, the control signal WESB is shifted to "H", but the IO and the IOB are not varied, and held at Vcc. Thereafter, when the column selection signal CSLi becomes the Vss, the node1 is latched to the Vss, the node2 is latched to the Vss, and the cell is returned to the latched state directly after the verifying to read.

In FIG. 13, for the operation of writing "1", the node1 is latched to the Vss, and the node2 is latched to the Vcc by the verifying to read. When the column selection signal CSLi becomes the Vcc, the Vcc is output to both the IO and the IOB. In this state, as described above, the latched data is not destroyed. Then, the control signal WESB is shifted to "H", but the IO is not varied, but held at Vcc, and the IOB is inverted to the Vss. Thus, the node1 is latched to the Vcc, the node2 is latched to the Vss, and the latched state directly after the verifying to read is inverted. Thereafter, when the column selection signal CSLi becomes the Vss, the node1 is latched to Vcc, the node2 is latched to the Vss, and the data is latched to the inverted state directly after the read verifying.

As described above, when the data for one page are latched, the clock $\phi_{CD}$ becomes "H". Then, the $\phi_{CD}$ and the $V_{BT}$ are shifted from the Vcc to an intermediate potential $V_M$, and the bit line becomes $V_M$ or Vss by the data. That is, the $V_M$ is supplied to the bit line of the memory cell which is sufficiently electron injected, not necessary to be further injected and written with "0", the Vss is supplied to the bit line of the memory cell which is insufficiently electron injected, necessary to be further injected and written with "0", and the $V_M$ is supplied to the bit line of the memory cell in which "1" is written.

Figure 14:
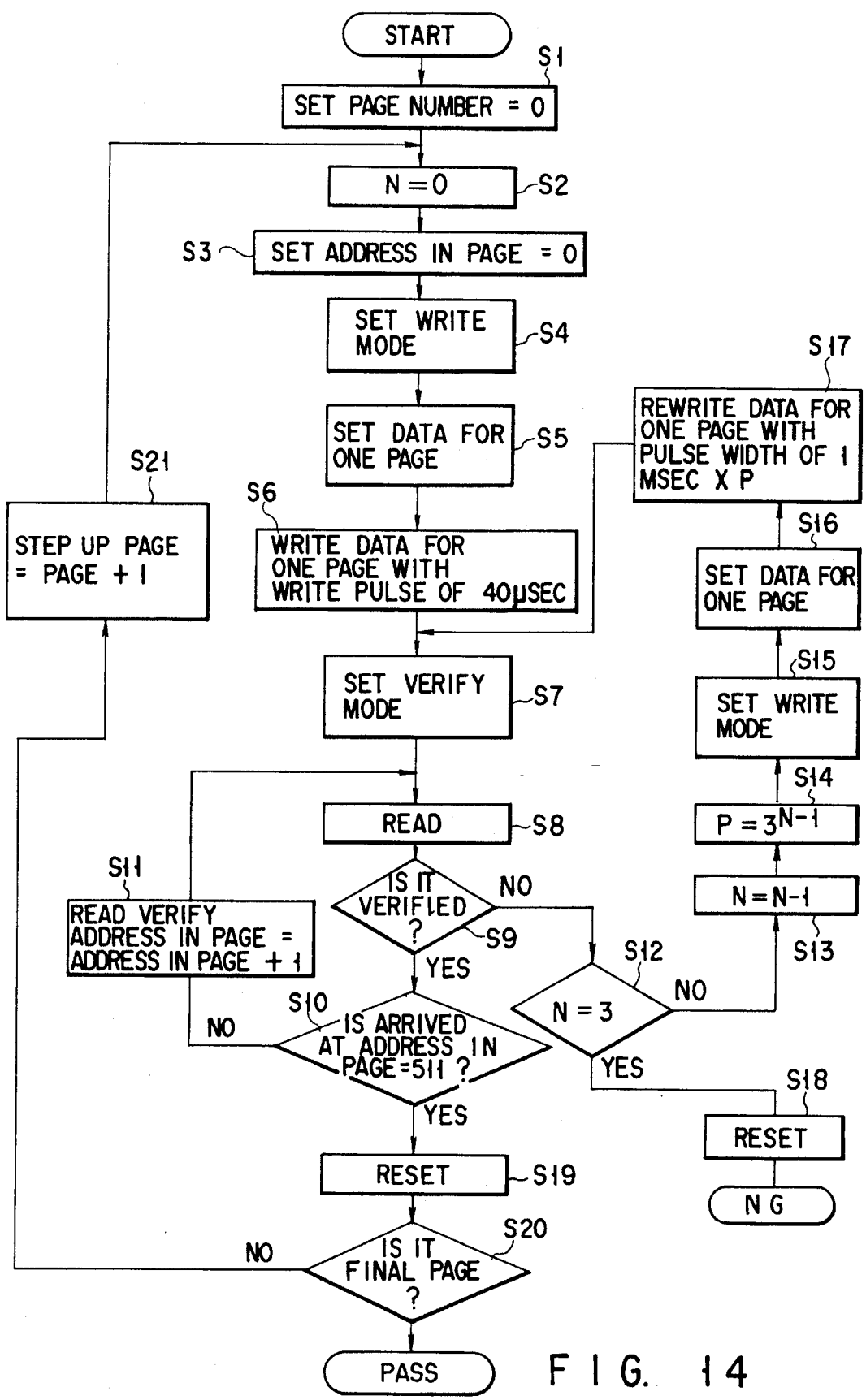
FIG. 14 is a view showing an algorithm of a verifying operation of the present invention.

The system of FIG. 2 having the NAND cell type EEPROM including the above-described construction and the basic operation mode is written with data and verified for the writing state by an algorithm shown in FIG. 14. Here, the algorithm of the case where 4096 memory cells (that is, column addresses 0–511) along one control gate line are used for one page and data writing and verifying are repeated in a page mode is shown.

A page number "0" is set to an initial page (in step S1), then the number N indicating data writing count is set to N=0 (in step S2), and an address in page is set to "0" (in step S3). Then, a write mode is set (in step S4), data for one page are set (in step S5), and the data for one page are written with a write pulse of 40 μsec (in step S6).

When the writing is ended, a write verify mode is set (in step S7), the memory cell is read (in step S8), and whether or not the write state is sufficient is verified (in step S9). If the writing is insufficient, whether or not N<3 is judged (in step S12). If this judged result is NO, the N is stepped up (in step S13), and the number P for determining the rewriting time is calculated (in step S14).

Then, the write mode is again set (in step S15), the data for one page are set (in step S16), and the data for one page is rewritten with a pulse width of P×1 msec (in step S17). Then, a write verify mode is set (in step S7), the cell is read (in step S8), and whether or not the write state is sufficient is verified (in step S9). If sufficient writing is verified, whether or not the address in the page is arrived at 511 is judged (in step S10). If NO, next address (=address in page+1) is sequentially verified to be read (in step S11).

When the above-described operation is repeated and sufficient data writing of the memory cell for one page is verified, the verify read mode is released (in step S19), and the data for one page is completely written.

If the data writing is not ended even if the data rewriting is repeated three times, any malfunction is judged in the memory cell, the verify mode is reset (in step S18), and the writing is ended.

When the data for one page are ended to be written, the verify mode is reset (in step S19), and whether or not the final page is arrived is Judged (in step S20). If NO, the page number is stepped up (=page+1) (in step S21), and the verify write operation is repeated. When the final page is judged, the writing is ended.

The fact that the pulse width of the rewriting (in step S17) is set to 1 msec and largely increased as compared with 40 μsec of the first pulse width will be described.

When the case where the distribution of the threshold value after writing is fallen within 0.5 to 3 V is considered, it is not necessary to rewrite the cell having the threshold of 0.5 V or more with the 40 μsec of the first pulse width. It is natural to write the cell to be mostly easily written by a voltage not exceeding 3 V with the 40 μsec of the pulse width of the threshold value of the cell. A problem resides in the cell in which the threshold value does not reach 0.5 V nearly with 40 μsec of the pulse width. The upper limit of the rewriting pulse width is determined according to how long writing time is taken to have the threshold value of 3 V by the cell which in which the threshold value does not reach 0.5 V nearly with 40 μsec of the pulse width. Since the variable amount in the threshold value is exponentially reduced with respect to the writing time, in the cell in which the threshold value does not reach 0.5 V nearly with 40 μsec of the pulse width, the threshold value does not exceed 3 V even if the rewriting pulse of about 1 msec is applied.

The width of the writing pulse may be increased as below in the chip. This is effective when an automatic verify is executed in the chip. In order to the pulse width, as shown in FIG. 15, a ring oscillator 51, a first counter 52 for generating a signal when the pulse counts generated from the ring oscillator 51 reaches a specified count or setting a programming time, a second counter 53 for storing the rewriting counts and setting the specified count or counting a programming count, and a reset signal generator 54 for taking a logic of the counters 52, 53 and outputting a pulse signal of a predetermined width and a reset signal are used.

In the embodiment described above, the rewriting pulse width is increased by two or three times. Since the setting of the magnification has the degree of freedoms like Tp=40× $K^N$ (K is arbitrary), it may not always geometrically increase. That is, the pulse width may be so set as to shorten the pulse width in the small range of N having large variation amount in the threshold value (like 40 μsec→40 μsec→80 μsec→160 μsec).

The rewriting pulse width may be increased each time when rewriting several times. For example, the rewriting pulse width may be increased by twice each time when rewriting twice like (40 μsec→40 μsec→120 μsec→160 μsec). The rewriting pulse width may be arithmetically set to Tp=40×(N+1) and increased (like 40 μsec→80 μsec→120 μsec→160 μsec). Further, the rewriting pulse width may be exponentially increased.

As described above, the rewriting pulse width may be increased or varied according to an arbitrary mathematical formula. How to increase the rewriting pulse width is externally stored (e.g., in a CPU), and the rewriting pulse width may be arbitrarily determined.

Figure 16:
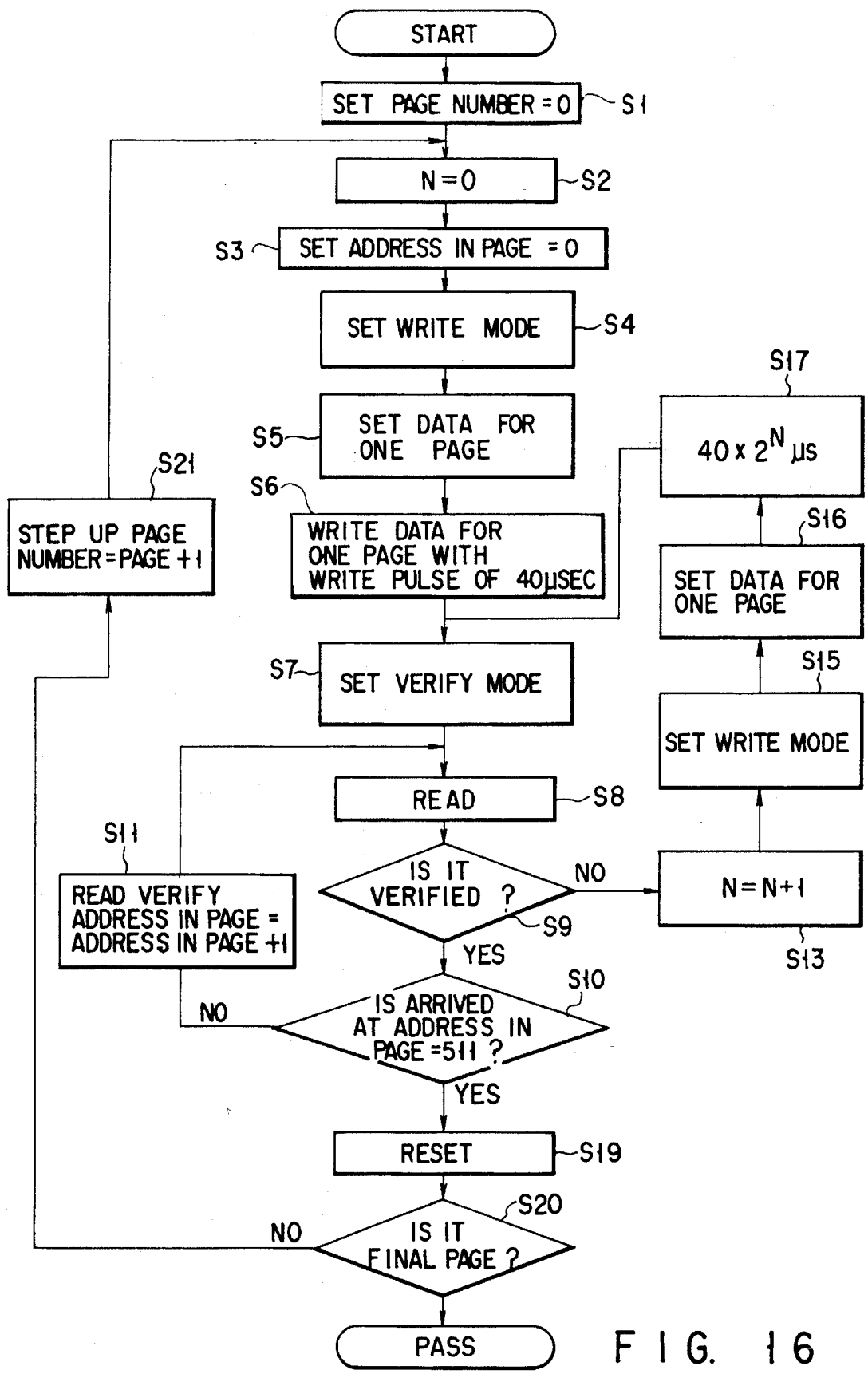
FIG. 16 is a view showing another example of an algorithm of verifying operation of the present invention.

The case where the width of the rewriting pulse is increased by twice will be described by referring to FIG. 16.

First, a page number "0" is set to an initial page (in step S1), the number N indicating the data writing count is set to N=0 (in step S2), and the address in page is set to "0" (in step S3). Then, a write mode is set (in step S4), data for one page is set (in step S5), and the data for one page is written with a write pulse of 40 μsec (in step S6).

When the writing is ended, a write verify mode is set (in step S7), the memory cell is read (in step S8), and whether or not the write state is sufficient is verified (in step S9). If the writing is insufficient, the N is stepped up (=N+1) (in step S13). Then, the write mode is again set (in step S15), data for one page is set (in step S16), and the data for one page is rewritten with a pulse width of 40×$2^N$ μsec (in step S17). Then, a write verify mode is set (in step S7), the cell is read (in step S8), and whether or not the write state is sufficient is verified (in step S9). If the sufficient writing is verified, whether or not an address in page is arrived at 511 is judged (in step S10). If NO, the next address (address in page+1) is sequentially verified to be read (in step S11).

When the above-described operation is repeated and sufficient data writing in the memory cell for the data for one page is verified, the verify read mode is reset (in step S19), and the writing of the data for one page is ended.

When the writing of one page is ended, the verify mode is reset (in step S19), and whether or not the final page is arrived at is judged (in step S20). If NO, the page number is stepped up (=address in page+1) (in step S21), and the verify writing operation is repeated. When the final page is judged, the writing is ended.

Figure 17:
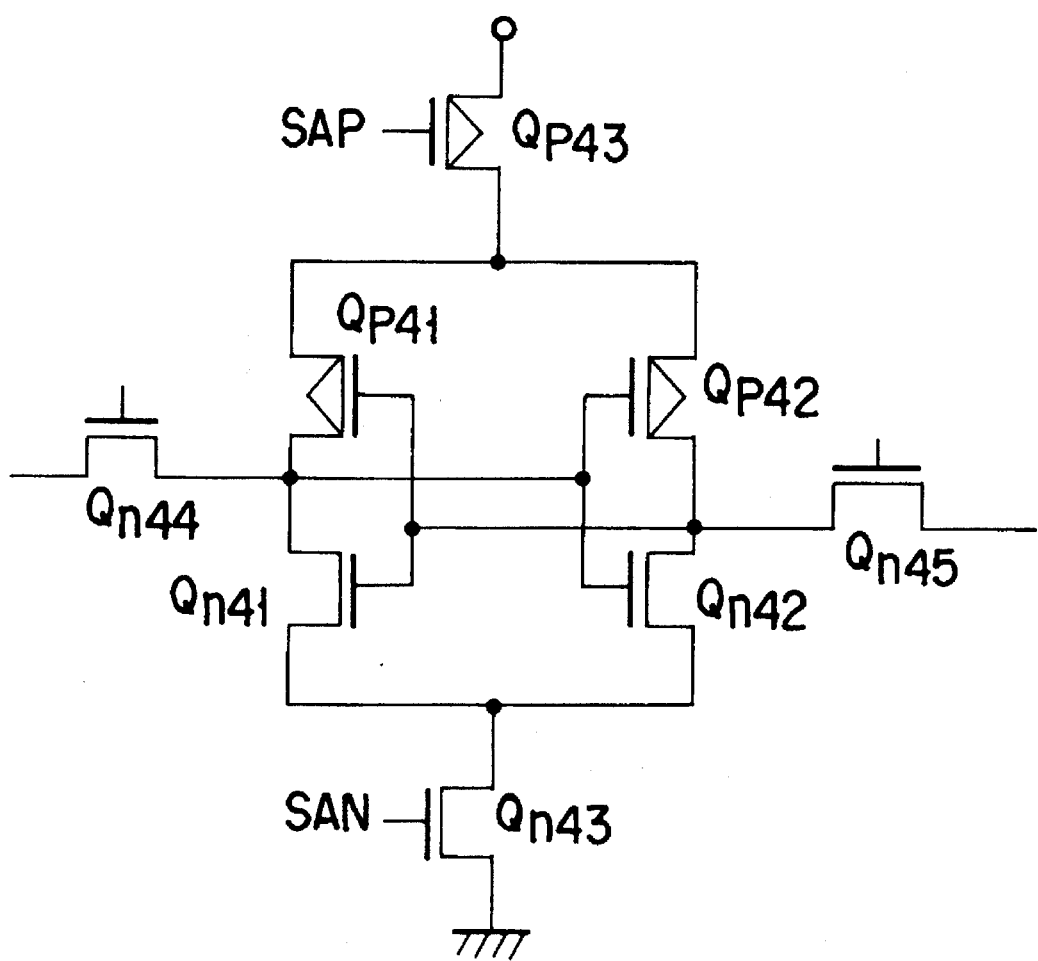
FIG. 17 is a view showing an example of a construction of a CMOS flip-flop,type sense amplifier.

The sense amplifier/data latch circuit of FIG. 10 has the signal synchronization type inverter using the E type p-channel MOS transistors Qp1, Qp2 and the E type n-channel MOS transistors Qn1, Qn2, and the signal synchronization type inverter using the E type p-channel MOS transistors Qp3, Qp4 and the E type n-channel MOS transistors Qn3, Qn4 in combination, and a sense amplifier/data latch circuit having CMOS flip-flop circuit is shown in FIG. 17.

Further, FIG. 10 shows the example in which the column selection signal CSLi is common for a plurality of the bit lines. If the CSLi is divided for the respective bit lines, the CSLi remains "L" and is not opened if "0" data is input at the time of reinputting data in the case of verifying without the above-embodiment, while if "1" data is input, the CSLi is set to "H" and opened, and the latched data may be inverted.

The example of the case where the CMOS flip-flop type sense amplifier shown in FIG. 17 is used will be described by referring to FIG. 18.

As described above, when the sense amplifier using the CMOS flip-flop is applied to the NAND cell type EEPROM as it is, if the potential of the bit line is not varied, data cannot be read. The sense amplifier of the example of FIG. 18 solves this problem.

The sense amplifier body has a CMOS flip-flop including n-channel MOS transistors Qn41, Qn42 and p-channel MOS transistors Qp41, Qp42. An activating n-channel MOS transistor Qn43 is provided at the common source node of the n-channel MOS transistors Qn41, Qn42, and similarly an activating p-channel MOS transistor Qp43 is provided at the common source node of the p-channel MOS transistors Qp41, Qp42. Qn46 is an n-channel MOS transistor for equalizing the two nodes of the flip-flop. The two nodes $N_1$ and $N_2$ of the flip-flop are connected to bit lines $BL_L$, $BL_R$ through transfer gate n-channel MOS transistors Qn44, Qn45. In the memory cell, the number of the same degree are connected through the sense amplifier so as not to have a large unbalance in the load capacities of the bit lines.

Here, as a characteristic structure (though not shown), in the transistors for constituting the CMOS flip-flop, the channel width of the n-channel MOS transistor Qn42 is twice as large as that of the n-channel MOS transistor Qn41, and the channel width of the p-channel MOS transistor Qp42 is twice as large as that of the p-channel MOS transistor Qp41. That is, the sizes of the elements are so determined that the driving capacity of the n-channel MOS transistor Qn42 is larger than that of the n-channel MOS transistor Qn41 and the driving capacity of the p-channel MOS transistor Qp42 is larger than that of the p-channel MOS transistor Qp41.

The operation of the sense amplifier having the above-described configuration will be described by referring to the waveform diagrams of FIG. 19 and FIG. 20.

FIG. 19 is a waveform diagram at the time of random accessing by selecting a memory cell $ML_8$ of a bit line $BL_L$ side.

In this case, the bit line $BL_R$ has a role of a reference potential. In the operation, a gate signal EQ of the equalizing transistor Qn46 is set to "H", to precharge both the bit lines $BL_L$, $BL_R$ to an equal potential. Here, it is set to (½)Vcc. In this method, for example, the bit line $BL_L$ is precharged to the Vcc, the bit line $BL_R$ is precharged to Vss in a floating state, and the equalizing signal EQ is set to "H", or the bit lines $BL_L$ or $BL_R$ may be supplied with (½)Vcc from a peripheral circuit. The precharging potential is not limited to the (½)Vcc.

In the meantime, an activating signal $\phi_{SAP}$ is set to "H", and an activating $\phi_{SAN}$ is set to "L", and the flip-flop is inactivated. Then, the Vcc is applied to the selective gate transistors SGL1, SGL2 of the selected NAND cell, the Vss is applied to the control gate of the selected memory cell, and the Vcc is applied to the control gate of the nonselective memory cell. At this time, if the selected memory cell $ML_8$ is "0" (Vth> 0), no cell current flows, and the bit line $BL_L$ is held at (½)Vcc. If the cell $ML_8$ is "1" (Vth<0), a cell current flows, and the bit line $BL_L$ is dropped from the (½)Vcc.

On the other hand, the selective gate and the control gate of the NAND cell connected to the bit line $BL_R$ connected to the node $N_2$ of the flip-flop remain the Vss, the bit line $BL_R$ remains (½)Vcc level.

In the case of reading "0", as described above, both the bit lines $BL_L$ and $BL_R$ are the same potential (½)Vcc, but in this state, the activating signal $\phi_{SAN}$ of the n-channel side is set to "H", and the node $N_3$ in the flip-flop is slowly dropped to the Vss level. At this time, since the channel width of the MOS transistor Qn42 is twice as large as that of the MOS transistor Qn41, a current of about twice flows to the MOS transistor Qn42. Accordingly, the node $N_2$ is dropped to the Vss potential faster than that of the node $N_1$.

In the case of reading "1", the bit line $BL_R$ is held (½)Vcc, but a cell current flows to the bit line $BL_L$, and it is dropped to about (½)Vcc–0.5 V. In this state, the activating signal $\phi_{SAN}$ of the n-channel side is set to "H", and the potential of the node $N_3$ is dropped. In this case, the MOS transistor Qn42 has twice channel length as large as the MOS transistor Qn41, but since the gate input voltage is 0.5 V lower, the node $N_1$ is dropped to the Vss potential faster than that of the node $N_2$.

As described above, after the bit line level difference is increased, the activating signal $\phi_{SAP}$ of the p-channel side is set to "L", and thus the difference of the bit line levels is increased, one is latched to the Vcc, the other is latched to the Vss, and the data is latched.

Figure 18:
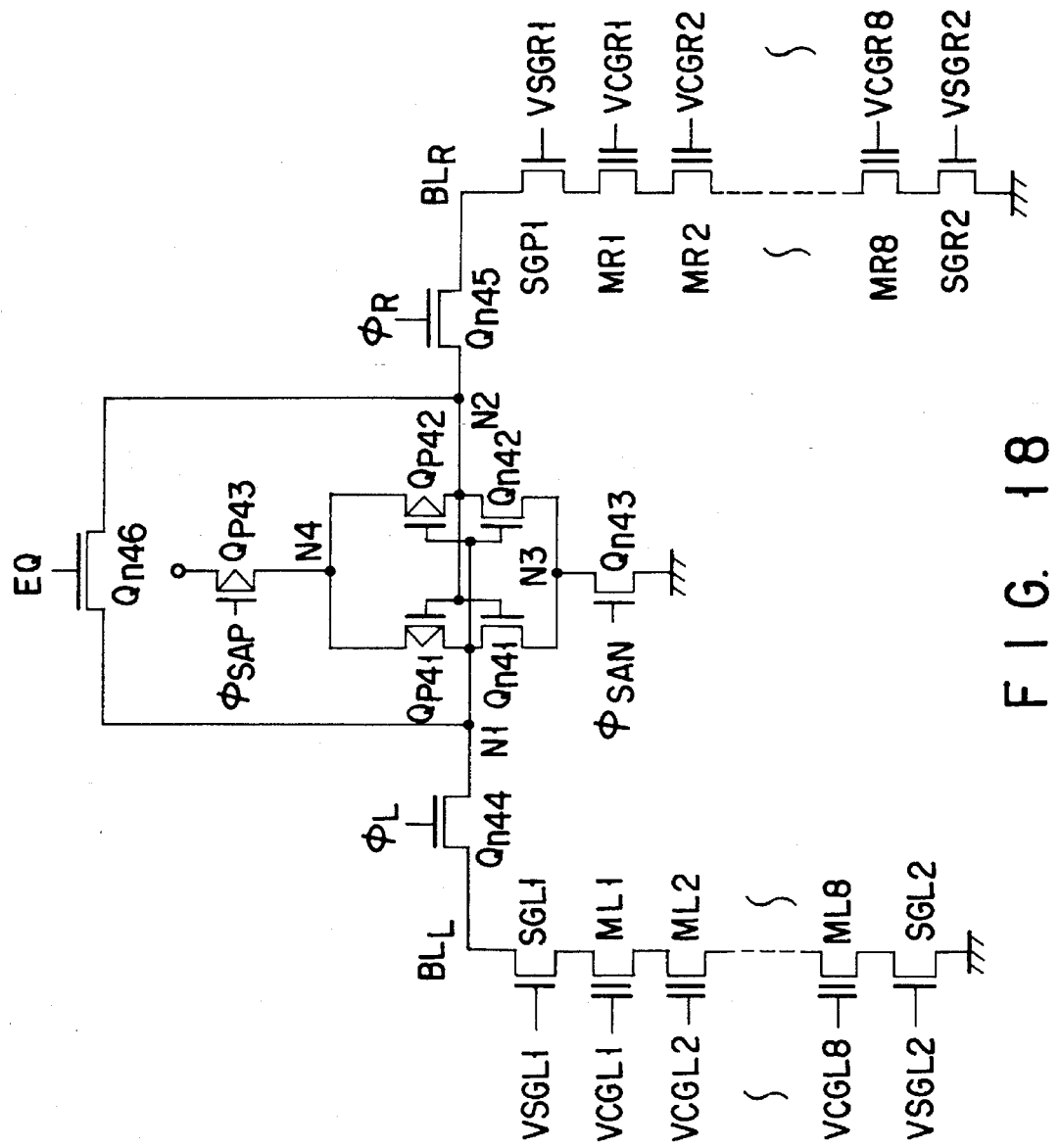
FIG. 18 is a view showing an example of a construction of exemplified CMOS flip-flop type sense amplifier.

The case where the memory cell $MR_8$ of the NAND cell of the right side of FIG. 18 is selected, will be described. The waveform of the operation at this time is shown in FIG. 20.

Similarly to the case shown in FIG. 19, after both the bit lines are equalized to (½)Vcc, the Vcc is applied to the selective gate transistors SGR1, SGR2, the Vss is applied to the control gate of the selected memory cell $MR_8$, and the Vcc is applied to the control gate of the other nonselective memory cell. At this time, if the selected memory cell $MR_8$ is "0", no cell current flows, and the bit line $BL_R$ is held (½)Vcc. If the cell $MR_8$ is "1", a cell current flows, and the bit line $BL_R$ is dropped from the (½)Vss. On the other hand, since the selective gate and the control gate of the NAND cell connected to the bit line $BL_L$ connected to the node $N_1$ of the flip-flop remain the Vss, the potential of the bit line $BL_L$ continuously remains (½)Vcc level.

In the case of reading "0", both the bit lines $BL_L$, $BL_R$ are all at the same potential (½)Vcc, but, in this state, the activating signal $\phi_{SAP}$ of the p-channel side is set to "L", and the node $N_4$ in the flip-flop is slowly raised to the Vcc level. Since the channel width of the transistor Qp42 is twice as large as that of the transistor Qp41, the transistor Qp42 has about double the current driving capacity. Accordingly, the node $N_2$ is raised to the Vcc potential faster than that of the Node $N_1$.

In the case of reading "1", the bit line $BL_L$ is held at (½)Vcc, but a cell current flows to the bit line $BL_R$, and dropped to about (½)Vcc–0.5 V. Here, the node $N_4$ is raised to the Vcc. In this case, the transistor Qp42 has a channel length twice as large as the Qp41, but since the gate input voltage is 0.5 V higher, the node $N_1$ is raised to the Vcc potential faster than that of the node $N_2$. As described above, the bit line potential difference is increased by setting the n-channel side activating signal $\phi_{SAN}$ to "H", and the data is latched.

In summary, when the memory cell of the left side is read, the n-channel side activating signal $\phi_{SAN}$ is previously raised, while when the memory cell of the right side is read, the activating signal $\phi_{SAP}$ of the p-channel side is previously dropped, and thus even if the reference potential and the detected potential are the same, the flip-flop can be operated to a desired stable state.

Figure 20:
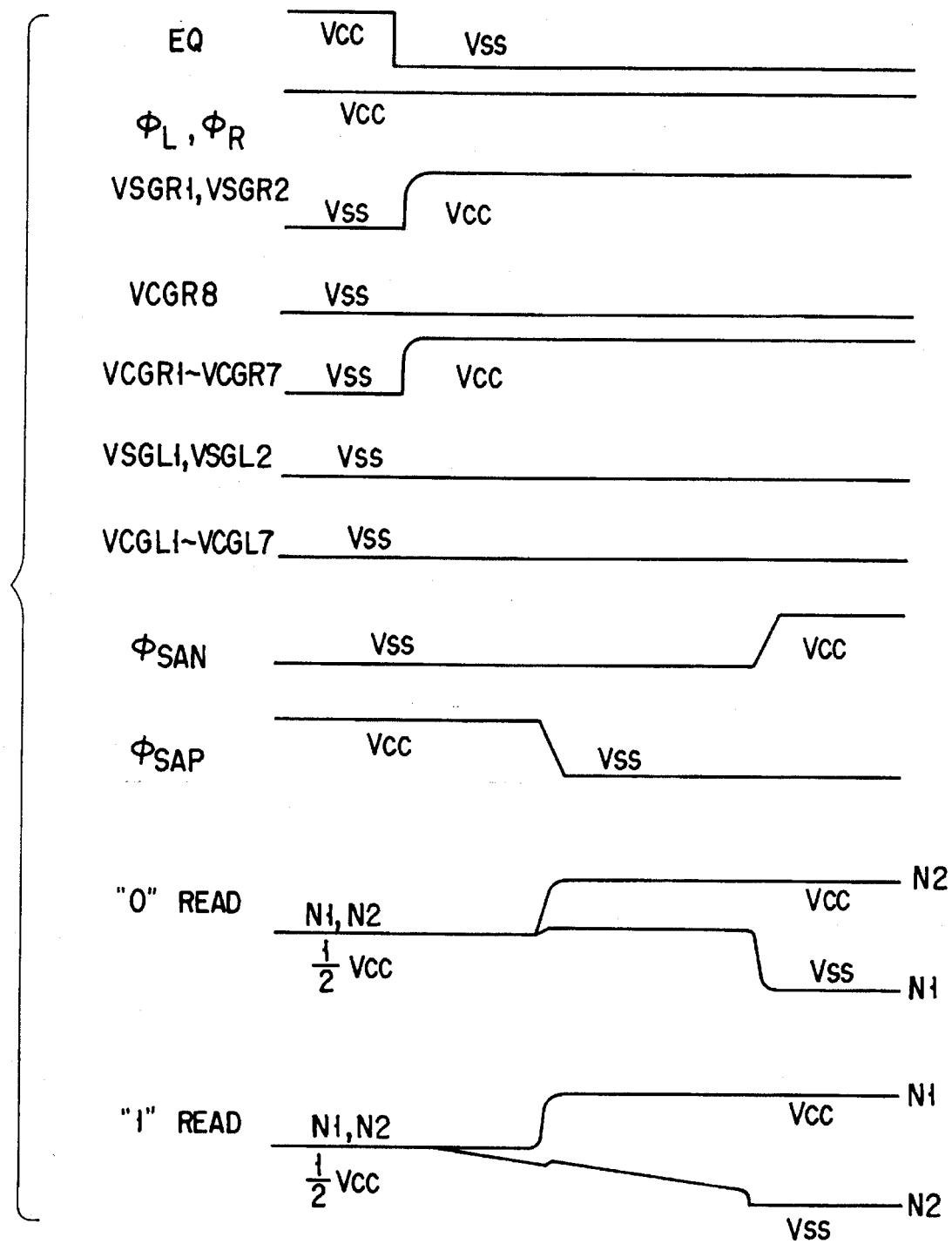
FIG. 20 is a timing chart of the case where a memory cell of right side of FIG. 18 is read.

Referring to FIG. 19 and FIG. 20, the case where the channel width of the transistor for constituting the flip-flop is varied, is described. However, since it is preferable that the current driving capacities of the flip-flops are different, the present invention is not limited to the case where the channel width is varied, but other various methods may be considered. For example, the channel lengths may be varied. Threshold value voltages may be varied. The thickness of the oxide film of the transistor may be varied. Or, a combination of these may be employed.

Figure 21:
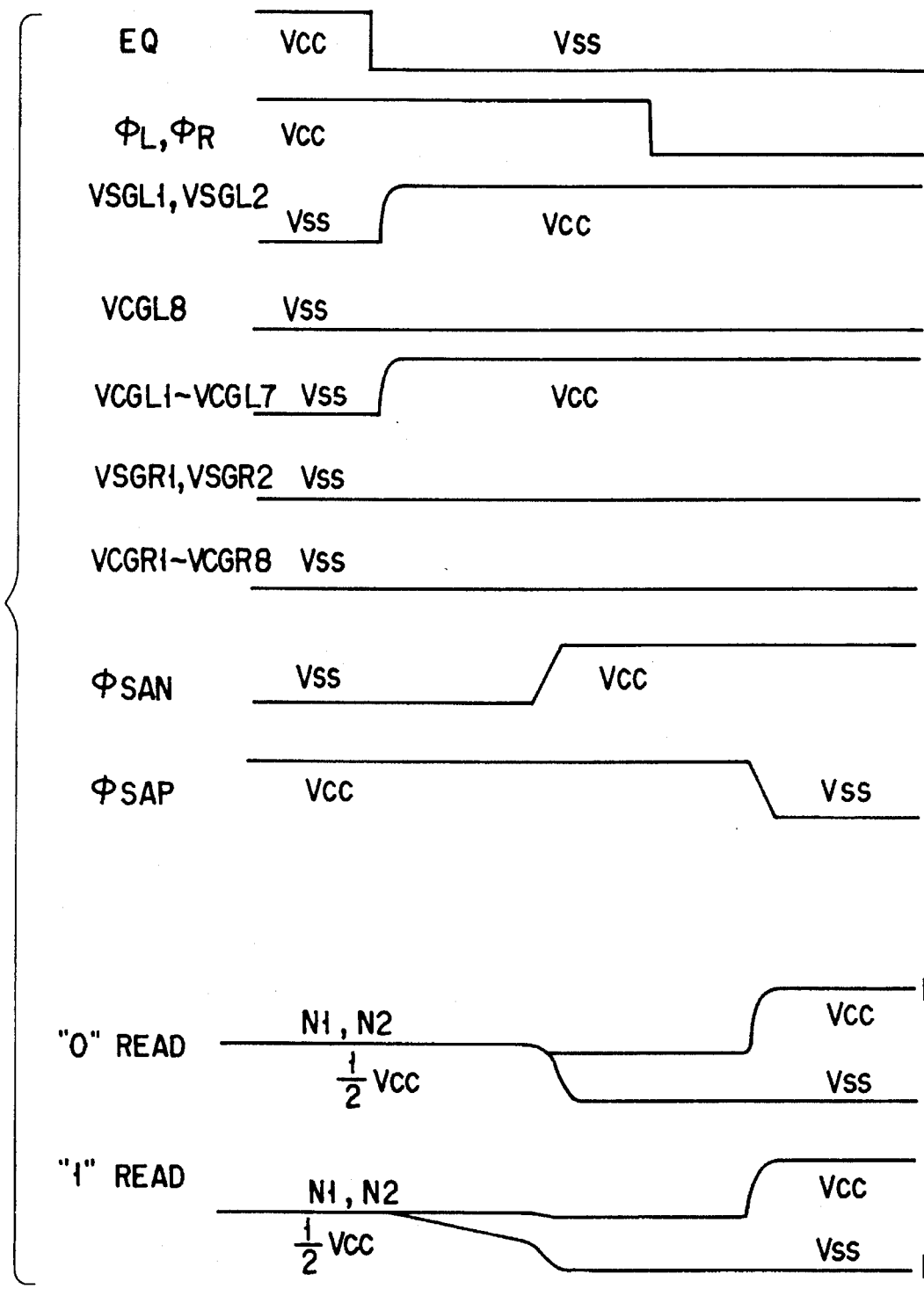
FIG. 21 is a timing chart showing a modified example of timing of each signal at the time of reading.

The timing of the signals at the time of reading may be variably altered. For example, in FIG. 19 and FIG. 20, after the activating signal $\phi_{SAN}$ is set to "H" or the activating signal $\phi_{SAP}$ is set to "L", when the potential difference of the bit lines is sufficiently increased, the control signals $\phi_L$ and $\phi_R$ of the transfer gate transistors Qn44 and Qn45 are set to "L", and the bit lines may be separated from the flip-flop. Thus, since the following bit line capacity is not observed from the sense amplifier, a high speed sensing is performed. The timing chart of this case is shown in FIG. 21.

Figure 22:
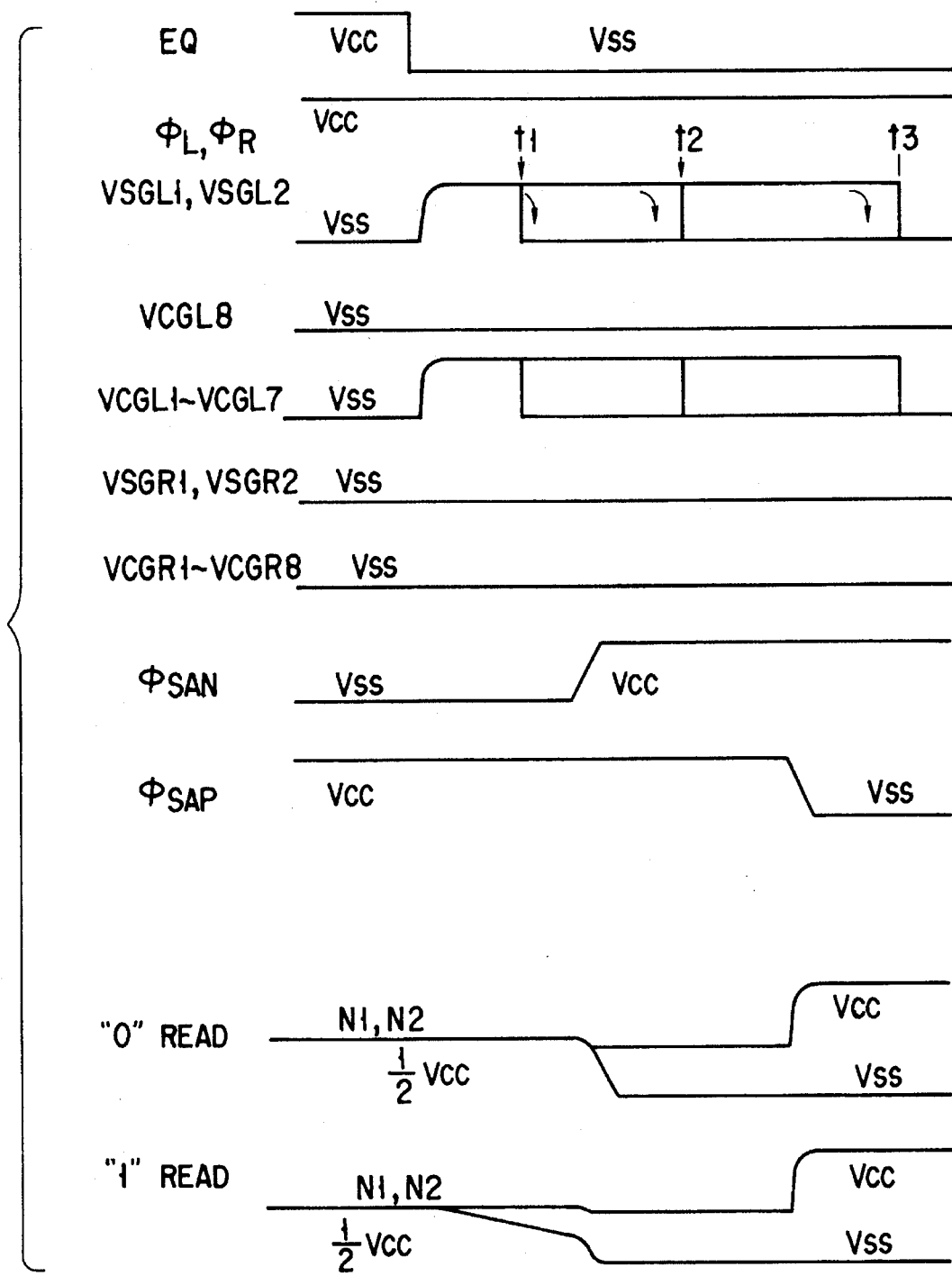
FIG. 22 is a timing chart showing another modified example of timing of each signal at the time of reading.

Further, in FIG. 19, at the time of reading "1", a cell current flows, and after the potential of the bit line is dropped a certain degree, the selective gate and the control gate potential of the nonselective memory cell may be set to Vss. The timing may be, as shown in FIG. 22, before the n-channel side activating signal $\phi_{SAN}$ is set to "H" (time t1), after the n-channel side activating signal $\phi_{SAN}$ is set to "H" (time t2), or after the p-channel side activating signal $\phi_{SAP}$ is set to "L" (time t3). Similarly, the timing of FIG. 20 may be considered.

Further, the control timings of the selective gate and the control gate may be different.

As described above, the embodiment of the sense amplifier of the NAND cell type EEPROM is described. However, a similar sense amplifier may be applied to nonvolatile memories such as other EEPROM, EPROM, a mask ROM, etc., and various semiconductor memories.

Figure 23:
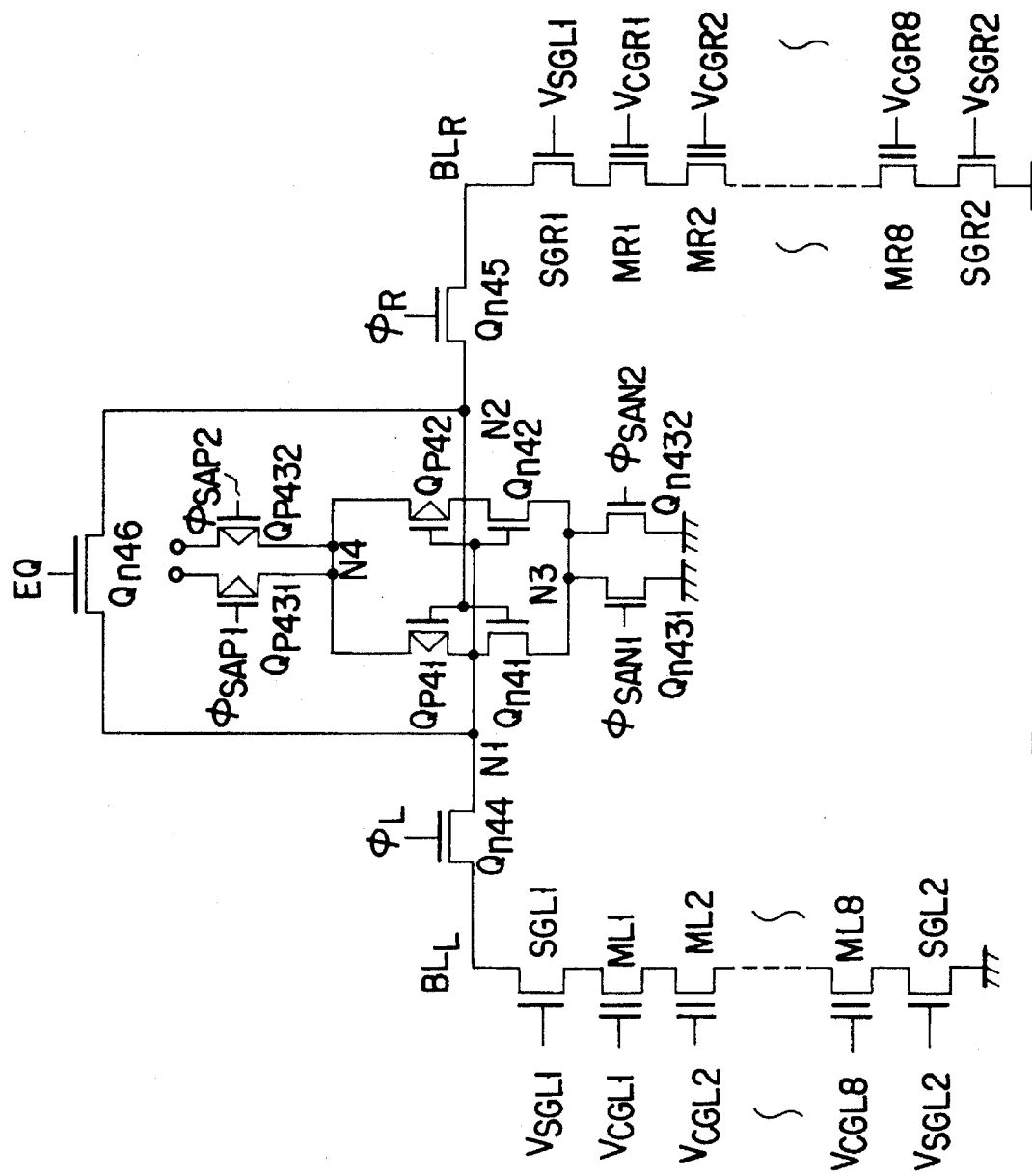
FIG. 23 is a view showing a flip-flop type sense amplifier of another embodiment.

FIG. 23 is a modified example of the sense amplifier of FIG. 18. As activating transistors, two p-channel MOS transistors Qp431, Qp432 are provided at a p-channel side, and similarly two n-channel MOS transistors Qn431, Qn432 are provided at an n-channel side. Here, the current driving capacity of the n-channel MOS transistor Qn431 is smaller than that of the n-channel MOS transistor Qn432, and the current driving capacity of the p-channel MOS transistor Qp431 is smaller than that of the p-channel MOS transistor Qp432. Except this, the configuration is the same as that in FIG. 18.

In the case of the sense amplifier of FIG. 23, when the n-channel side is previously activated from the p-channel side (when the memory cell of left side is read), the MOS transistor Qn431 is first turned ON by the activating signal $\phi_{SAN1}$, and then the MOS transistor Qn432 is turned ON by the activating signal $\phi_{SAN2}$. This operation is conducted by slowly dropping the potential of the common source potential, and quickly dropping the source potential by the transistor having large current driving capacity when the potential difference of both the bit lines is increased. When the p-channel side is previously activated (when the memory cell of right side is read), similarly the MOS transistor Qp431 having smaller current driving capacity is previously turned ON, and the MOS transistor Qp432 having larger current driving capacity is turned ON by delay.

The activation of the p-channel side when the memory cell of the left side is read and the activation of the n-channel side when the memory cell of the right side is read, are conducted irrespective of driving sequence of the two activating transistors. For example, when the memory cell of the left side of FIG. 23 is read, as described above, the activating signal $\phi_{SAN1}$ is previously set to "H", and then the activating signal $\phi_{SAN2}$ is set to "H". Thereafter, the p-channel side is activated. In this case, the timings of the activation signals $\phi_{SAP1}$ and $\phi_{SAP2}$ are such that the $\phi_{SAP1}$ may be earlier, both may be simultaneous, or only the $\phi_{SAP2}$ having larger driving capacity may be set to "L".

As described above, in the NAND cell type EEPROM, since the nonselective memory cell is used as a transfer gate, it is necessary to charge, for example, the control gate to Vcc at the time of reading. In this case, since a number of memory cells are connected to the control gate as a word line, its load capacity is very large, and its rising or falling time occupies most of the accessing time. Accordingly, there is a problem that a high speed accessing is difficult to obtain.

In order to solve this problem, it is preferable to charge the control gate of the nonselective memory cell previously of the source side selective gate or the drain side selective gate in a random access mode and to control to reversely delay discharging. The reason will be described with an example of charging the control gate of the nonselective memory cell previously of the source side selective gate.

Since the potential of the control gate of the nonselective memory cell operating as a transfer gate largely controls a cell current, it is necessary to accurately charge it to Vcc. On the other hand, since the source side selective gate has no back bias effect, when it becomes a threshold value determined by the process condition, for example, about 2 V or more, the cell current is not controlled. The time of charging the selective gate to 2 V is about ¼ of the time for charging it to Vcc. Then, the control gates of the drain side selective gate and the nonselective memory cell are previously started to be charged during precharging of the bit line. At this time, since the source side selective gate is closed, no current flows from the Vcc to the Vss. If the time of precharging the bit line is equal to the charging time of the selective gate and the fine control gate, since the chargings of the drain side selective gate and the control gate of the nonselective memory cell are ended after the bit line is precharged, the source side selective gate may be thereafter charged to 2 V. Thus, as compared with the case where the selective gate and the control gate of the nonselective memory cell are started to be charged after the bit line is precharged as the prior art, the time can be largely shortened.

More specifically, the embodiment applied by the operating timing as described above will be described.

Figure 24:
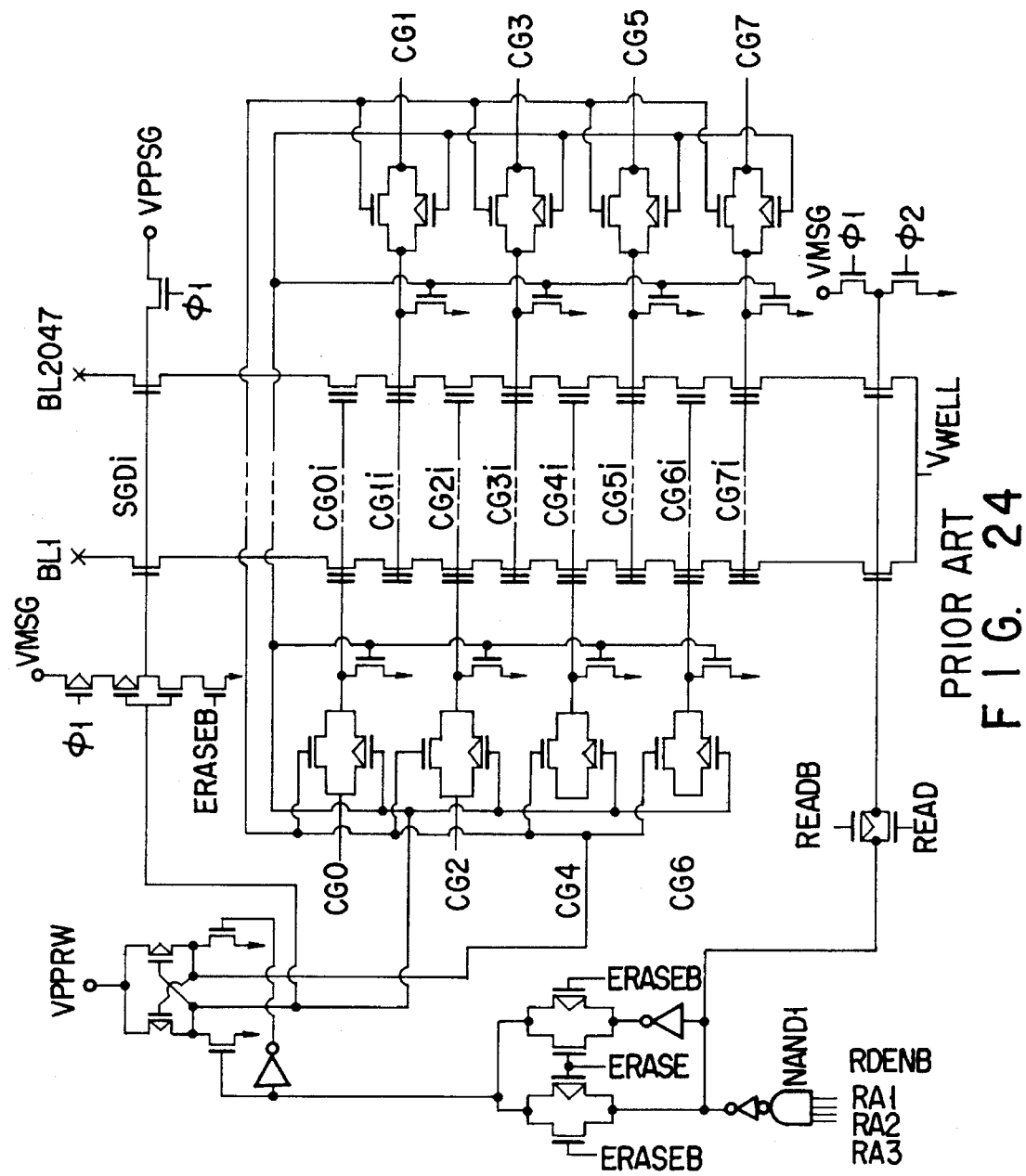
FIG. 24 is a view showing a construction of a conventional row decoder of an EEPROM realized for a high speed accessing.
Figure 25:
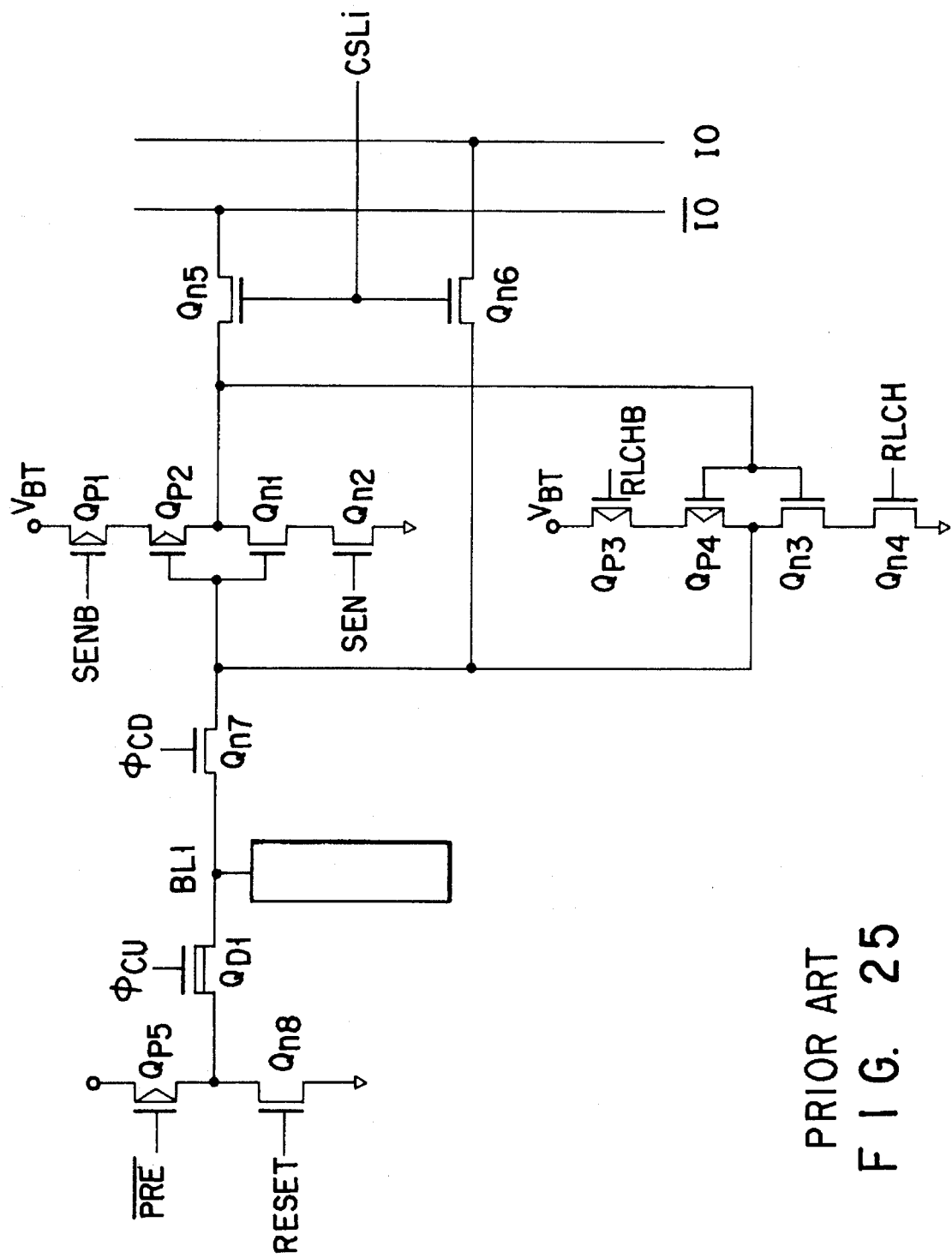
FIG. 25 is a view showing a construction of a conventional sense amplifier and data latch.
Figure 26:
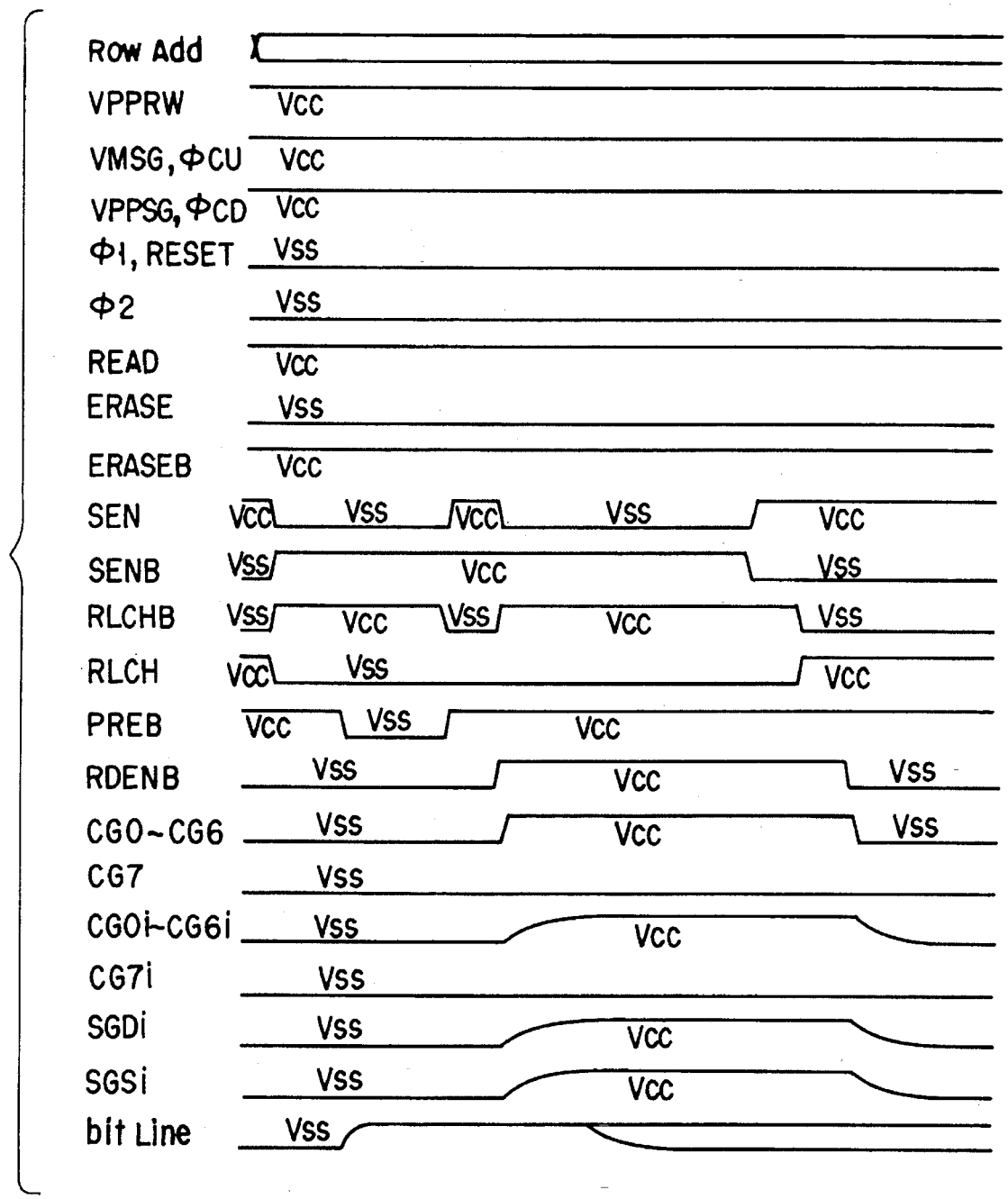
FIG. 26 is a timing chart of accessing according to a conventional method.

FIG. 24 shows the construction of a row decoder of this embodiment, and FIG. 25 shows the construction of a sense amplifier. The operating timings are as shown in FIG. 27 with respect to FIG. 26 of the prior art. The timings of FIG. 27 are different from those of FIG. 26 at signals RDENB, READ, READB, $\phi_2$, etc., regarding the control of the source side selective gate.

A random accessing is started by detecting the transfer of a row address similarly to the prior art. An activating signal of a sense amplifier using a signal synchronization type inverter is set such that SEN= "L", SENB="H", RLCH="L", RLCHB="H", an inverter is nonactivated, and the signal RDENB="H" is set, and the chargings of the drain side selective gate and the control gate of the nonselective memory cell are previously started to be charged. At this time, the source side selective gate is separated from the row decoder by the signals READ, READB, and set to Vss by the signal $\phi_2$.

Then, a signal PRE is set to "L", and thus the bit line is precharged to Vcc. At this time, since the drain side selective gate and the control gate of the nonselective memory cell are charged but the source side selective gate is closed, a discharge pass from Vcc to Vss is eliminated. Then, SEN= "H", RLCHB="L" are set, thus a latch circuit is reset, and the bit line is simultaneously additionally charged. Subsequently, SEN="L", RLCHB="H" are set, thus the sense amplifier is again nonactivated.

Then, a signal $\phi_2$ is set to "L", the READ is set to "H", and the READB is set to "L". Thus, the source side selective gate is charged. Since the source side selective gate is different from the control gate and the source is Vss, if it is charged to about 2 V, a cell current is not limited. Accordingly, the charging times of the selective gate and the control gate are substantially shortened from the time of charging them to the Vcc to the time of charging the source side selective gate to 2 V.

Figures 28A, 28B:
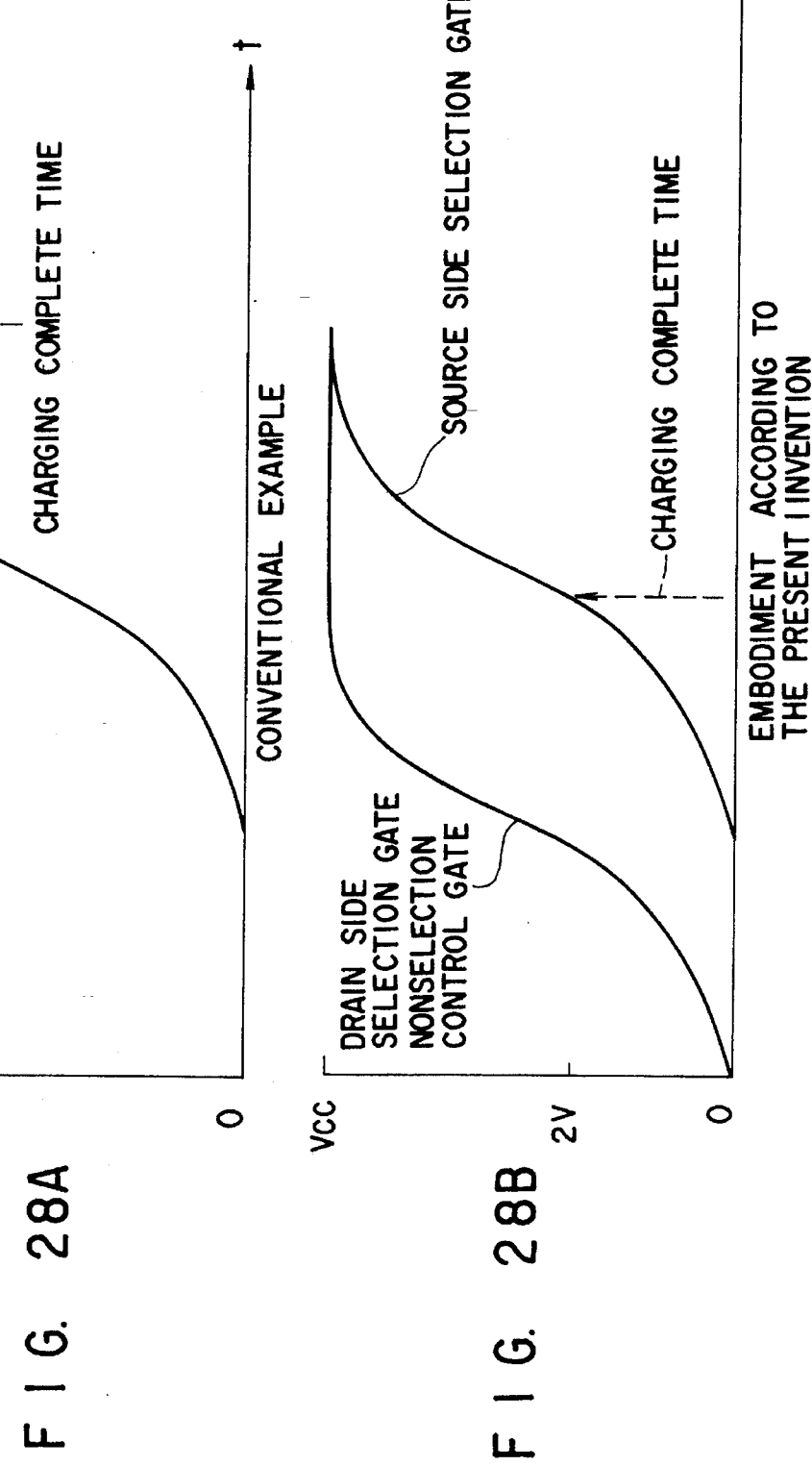
FIG. 28A and FIG. 28B are views showing the state of shortage of an accessing time according to the prior art and the embodiment of the present invention.

This state is shown in FIG. 28B in comparison with FIG. 28A of prior art example.

Thereafter, the potential of the bit line is varied by the data of the selective memory cell. SEN="H", SENB="L" are set, one signal synchronization type inverter which inputs from the bit line is activated, then RLCHB="L", RLCH="H" are set, thus the other signal synchronization type inverter is set, activated, thereby latching the read data. Thereafter, the latched data is externally output by the later column address selection signal CSL through the input/output sense amplifier, data output buffer.

The fall of the selective gate and the control gate of the nonselective memory cell can be similarly considered. If the source side selective gate is 2 V or more, a cell current is not limited, and hence the gate is previously fallen from the drain side selective gate and the control gate of the nonselective memory cell. If the source side selective gate is discharged, next random access mode can be started even in the state that the drain side selective gate and the control gate of the nonselective memory cell are not discharged.

Since the drain side selective gate is not controlled at a cell current as compared with the control gate, it may be driven at the same timing as that of the source side selective gate.

As described above, the cell current is controlled by the source side selective gate, thus the time required for the rising and falling times of the drain side selective gate and the control gate of the nonselective memory cell can be shortened, and the reading time can be shortened.

Figure 29:
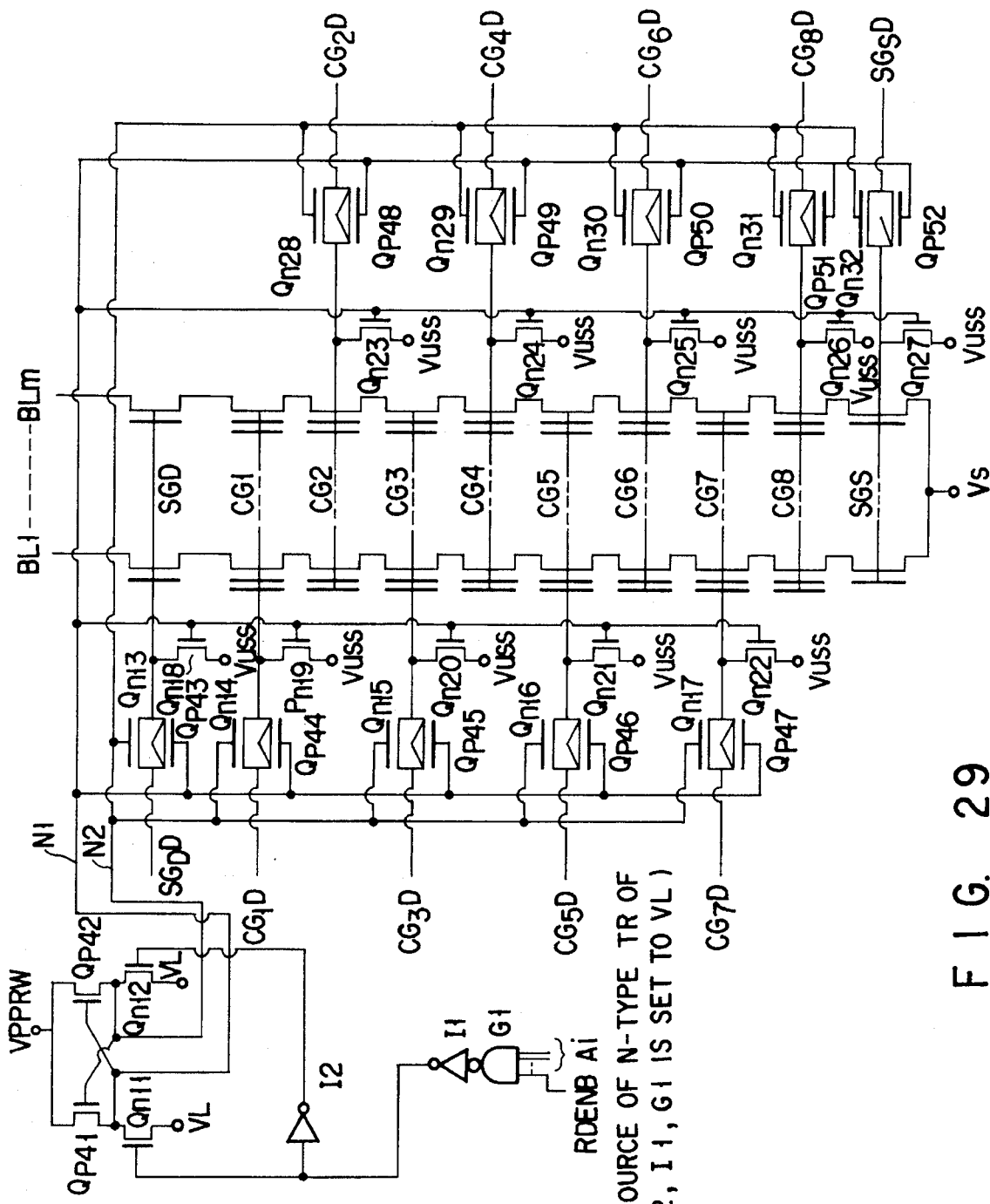
FIG. 29 is a view showing an exemplified example of a construction of a row decoder of FIG. 4 in another embodiment of the present invention.

FIG. 29 shows the construction of an example of a row decoder of FIG. 4 in another embodiment of the present invention.

In FIG. 29, one NAND cell block is selected by an address Ai and an enable signal RDENB in the NAND gate $G_1$.

The output of gate $G_1$ is input to a voltage switching circuit having p-type MOS transistors Qp41, Qp42 and n-type MOS transistors Qn11, Qn12.

n-type MOS transistors Qn18 to Qn27 are transistors for setting selective gates $SG_D$, $SG_S$ and control gates $CG_1$ to $CG_8$ to a potential Vuss when the NAND cell block is not selected.

Transistors Qn13, Qp43 are transfer gates for transferring $SG_{DD}$ to the selective gate when the NAND cell block is selected.

Transistors Qn32, Qp52 are transfer gates for transferring $SG_{SD}$ to the selective gate when the NAND cell block is selected.

Transistors Qn14 to Qn17, Qn28 to Qn31, Qp44 to Qp47, and Qp48 to Qp51 are transfer gates for transferring the inputs $CG_{1D}$ to $CG_{8D}$ of the control gates to the control gate when the NAND cell block is selected.

Figure 31:
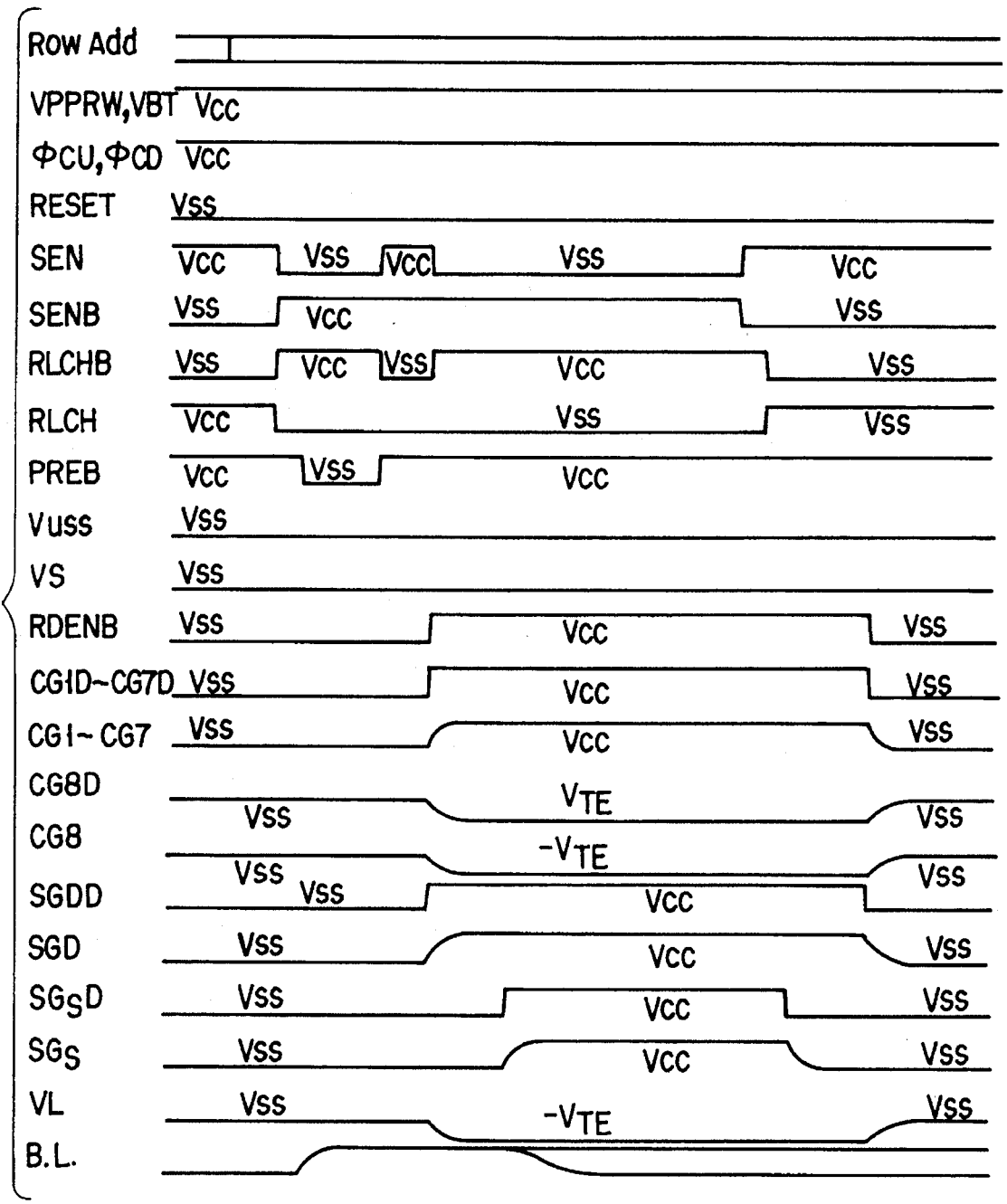
FIG. 31 is a timing chart of reading according to another embodiment of the present invention.

Referring to FIG. 30 and FIG. 31, the case where the distribution of negative threshold values is measured will be described as an example.

First, reading is started according to transfer of a row address. Then, SEN is set to "L", SENB is set to "H", RLCHB is set to "H", RLCH is set to "L", and a sense amplifier is nonactivated.

The source potential $V_L$ of p-type well formed with n-type transistors (Qn11 to Qn12, Qn13 to Qn32) of the row decoder and the n-type transistors (Qn11 to Qn12) of a voltage switching circuit, the source potential of the n-type transistors of inverters $I_1$ and $I_2$, the input potential $CG_{8D}$ of the control gate of the selected memory cell, and the "L" level of the address signal main Ai of a peripheral logic are lowered to a negative voltage $-V_{TE}$ for measuring the distribution of the threshold values (e.g. $-2$ V).

The input potential ($CG_{1D}$ to $CG_{7D}$, $SG_{DD}$) of the control gate of the nonselective memory cell and the drain side selective gate are set to Vcc, and the control gates $CG_1$ to $CG_7$ and the drain side selective gate $SG_D$ is charged to Vcc.

At this stage, since the input $SG_{SD}$ of the source side selective gate is Vss and the potential of the source side selective gate $SG_S$ is fixed to Vss, no leakage pass occurs between the bit line and the source line.

After the control gate of the selective memory cell becomes $-V_{TE}$ of a testing voltage, the input $G_{SD}$ of the source side selective gate is raised to Vcc, and the source side selective gate $SG_S$ is charged to Vcc. At this stage, if the threshold value of the selective memory cell is lower than the control gate voltage $-2$ V (in negatively deep direction), a cell current flows, and the bit line is charged to Vss. If the threshold value is shallower than the $-2$ V, no cell current flows, and the bit line holds the "H" level.

Thereafter, SEN is set to "H", SENB is set to "L", the bit line level is sensed, then RLCHB is set to "L", RLCH is set to "H", and data is latched. Next, the $SG_{SD}$ is set to Vss, and the source side selective gate $SG_S$ is set to Vss. This is conducted to generate a leakage pass between the bit line and the source line when the control gate of the selective memory cell is returned to the Vss, and to inhibit to generate leakage between the sense amplifier and the source line.

Then, the control gate CG of the nonselective memory cell and the drain side selective gate $SG_D$ are discharged to the Vss, and the p-type well of the n-type transistor biased to the negative voltage is returned to the Vss.

Thereafter, or simultaneously upon the operation, the column gate CSIi is selected, and the latched data are externally read through the IO and the IOB.

The above operation is conducted by varying the testing voltage to check the distribution of the negative threshold value.

This embodiment is modified as below, and executed.

Figure 32:
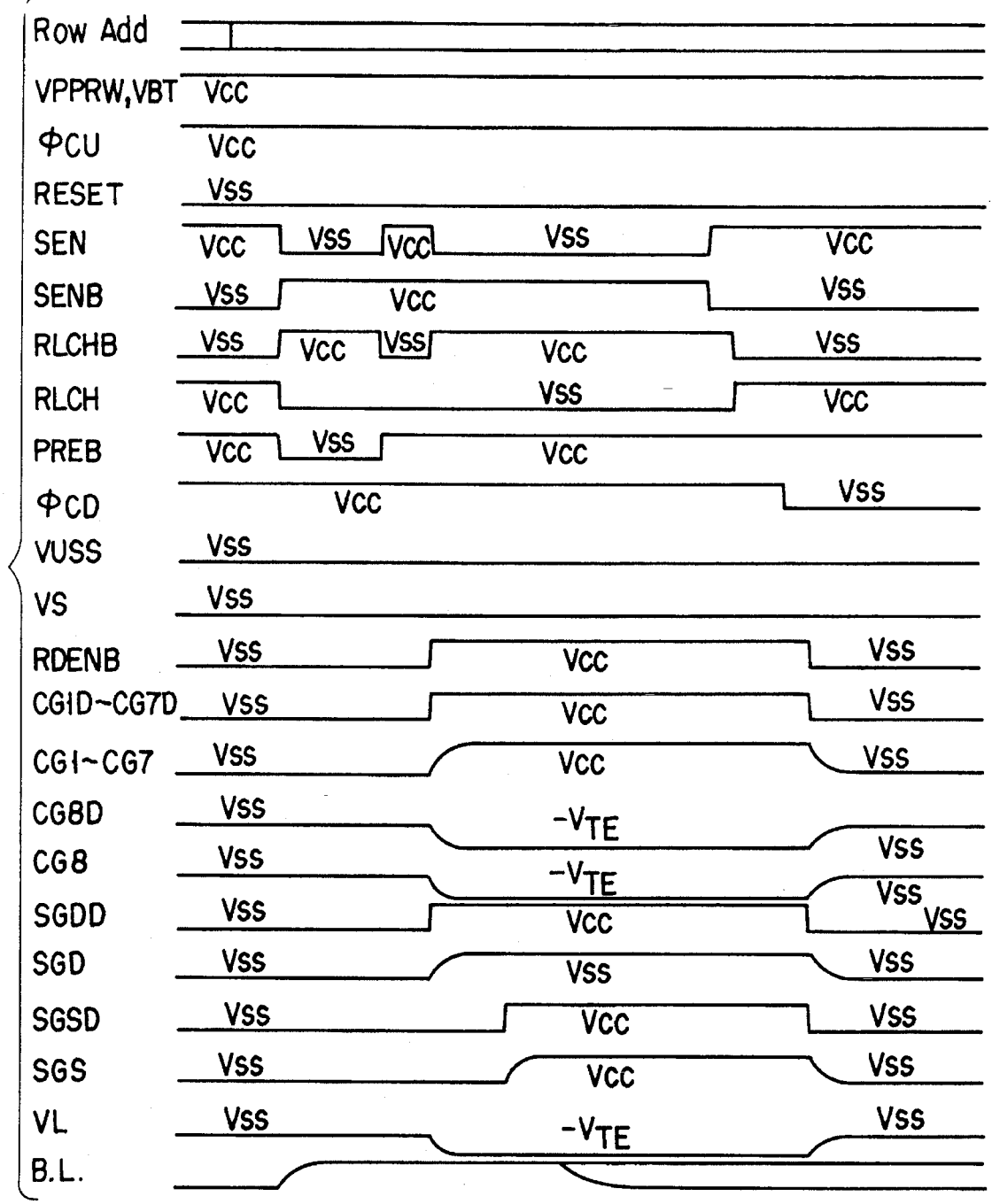
FIG. 32 is a timing chart of reading according to still another modified embodiment of the present invention.

For example, as shown in FIG. 32, after the data are latched, the $\phi_{CD}$ is set to "L", and the sense amplifier is separated from the bit line. Then, even if the control gate of the selective memory cell, the drain side selective gate and the source side selective gate are simultaneously discharged, no problem occurs.

Figure 33:
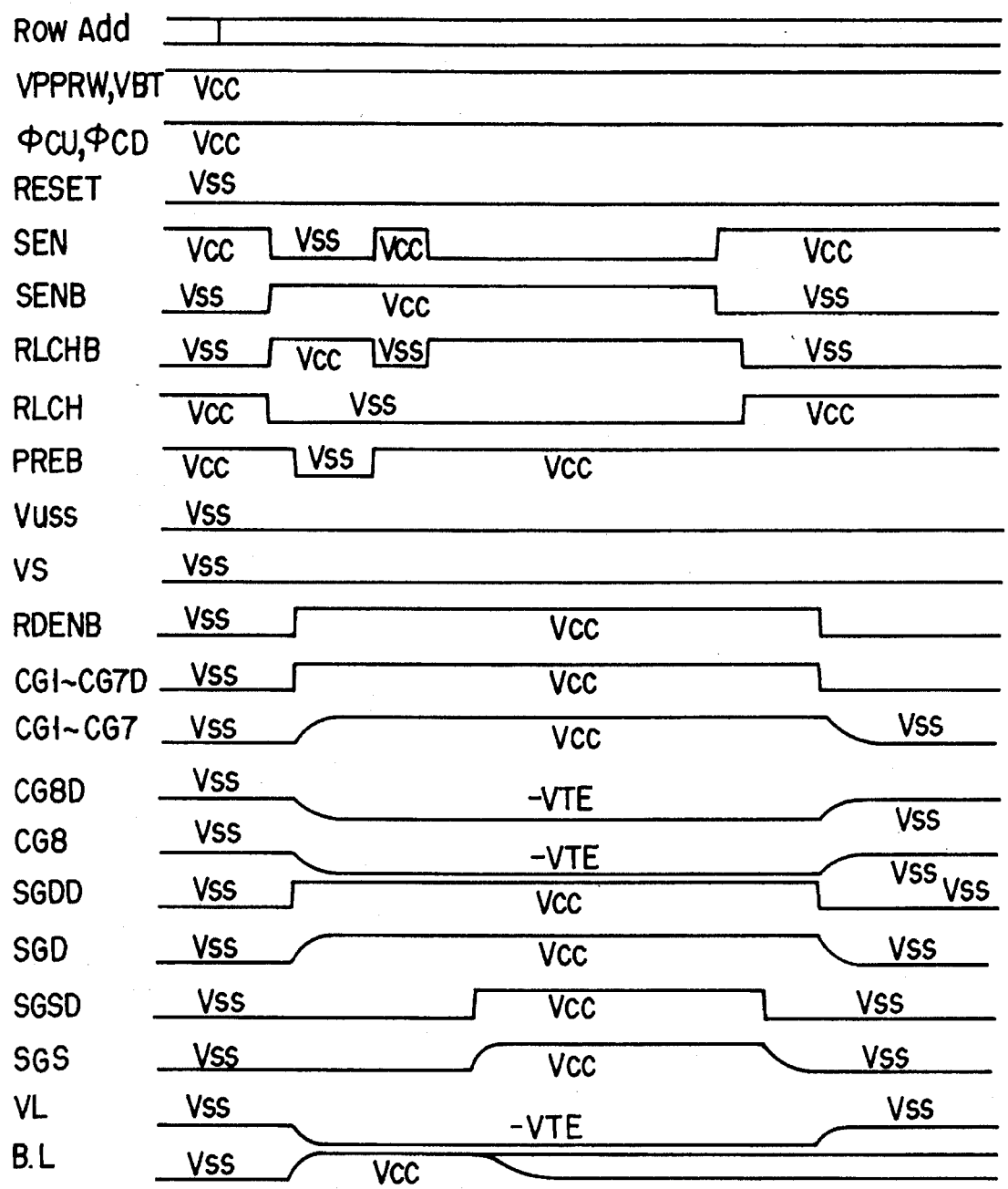
FIG. 33 is a timing chart of reading according to still further embodiment of the present invention.

Further, as shown in FIG. 33, charging of the bit line and chargings of the control gate and the drain side selective gate may be simultaneously executed.

In addition, in the above-described embodiments, for the purpose of preventing the penetration of the bit line and the source line, the charging of the source side selective gate is executed at a delayed timing from that of the control gate. However, the similar effect may be obtained even if the source side selective gate is replaced with the drain side selective gate (charging of the drain side selective gate is delayed). Further, both the source side and the drain side selective gates may be delayed from the charging of the control gate, and both are not always necessary to be executed at the same timing.

In the foregoing description, the case where the rises of the control gate and the selective gate are the same has been described. However, if the rise and fall of the selective gate are faster than those of the control gate, it is apparent that the effect is increased. This can be performed as below.

At least one of the drain and source side selective gates is lined by low resistance wirings.

In the embodiments described above, the floating gate is formed by lining a second layer polysilicon thereon, the control gate is formed by lining a second layer polysilicon, the selective gate is formed by lining the first layer polysilicon with a second layer polysilicon, and the bit line is formed of a first layer aluminum. Accordingly, at least one of the drain and source side selective gates may be, for example, lined with a third layer of polysilicon (polyside) having a low resistance or a second layer of aluminum.

It is impossible to line all the control gates and all the selective gates, but it is easy to line, for example, only one source side selective gate.

As described above, the effect is increased by lining at least one of the drain and source side selective gates with low resistance wiring. Further, since the wiring delay is a multiplication (so-called RC) of the resistance and the capacity, high speed rising or falling may be realized by a method for reducing the capacity by remarkably increasing the thickness of the oxide film of the selective gate.

The present invention is not limited to the particular embodiment shown in the drawings and described above. Various modifications may be made without departing from the spirit or scope of the general inventive concept as defined by the appended claims and their equivalents.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:

a memory cell array formed of a plurality of memory cells which are electrically rewritable, each of said memory cells including a MOS transistor having a control gate;

a plurality of selective gate transistors, each having a selective gate and coupled to at least one of said plurality of said memory cells;

a bit line coupled to at least one of said plurality of selective transistors;

a source line coupled to said bit line via at least one of said selective gate transistors and at least one of said memory cells; and charging means for charging the selective gate of one of the selective gate transistors and the control gate of one of said memory cells at different timings in a read operation.

2. The nonvolatile semiconductor memory device according to claim 1, wherein:

said charging means includes means for charging the control gate of said one of said memory cells prior to charging the selective gate of said one of the selective gate transistors.

3. The nonvolatile semiconductor memory device according to claim 1, wherein:

a preselected number of said plurality of memory cells form a memory cell unit, and said bit line and said source line are coupled to said memory cell unit.

4. The nonvolatile semiconductor memory device according to claim 1, wherein:

a preselected number of said plurality of memory cells are connected in series to form a NAND-type memory cell.

5. The nonvolatile semiconductor memory device according to claim 1, wherein:

said charging means includes means for charging the control gate of said one of said memory cells and said bit line at the same time.

6. The nonvolatile memory device according to claim 1, wherein said charging means charges the selective gate of one of the selective gate transistors and the control gate of one of said memory cells at different timing during a data reading operation.

7. A nonvolatile semiconductor memory apparatus, comprising:

a plurality of memory cells being electrically rewritable, each having a MOS transistor including a drain, a source and a control gate, so connected in series that said drain of one transistor and said source of another transistor adjacent thereto are formed in a shared region to form a memory cell array having a drain end and a source end, said memory cell array being divided into a plurality of blocks;

a first selective gate transistor having a first end and a second end connected to said drain end;

a bit line connected to said first end of said first selective gate transistor;

a second selective gate transistor connected to said source end; and charging means for charging said control gate of at least one nonselective memory cell included in one of said blocks earlier than at least one of said first and second selective gate transistors.

8. The nonvolatile semiconductor memory apparatus according to claim 7, wherein said charging means simultaneously charges the control gate of said at least one nonselective memory cell and said bit line.

9. The nonvolatile semiconductor memory apparatus according to claim 7, further comprising:

means for discharging said control gate of said at least one nonselective memory cell after the discharging of at least one of said first and second selective gate transistors.

10. A nonvolatile semiconductor memory device according to claim 7, wherein a preselected number of said plurality of memory cells are connected in series to form a NAND-type memory cell unit, and said bit line and said source line are coupled to said NAND-type memory cell unit.

11. The nonvolatile semiconductor memory device according to claim 10, wherein said charging means includes means for charging said control gates of said NAND-type memory cell unit before charging of said selective gate of said selective gate transistor.

12. The nonvolatile semiconductor memory device according to claim 11, wherein said memory cell further comprising a tunnel insulating layer and charge storage layer in which charges, to define data of said memory cell, are extracted or stored through said tunnel insulating layer.

13. An electrically erasable nonvolatile memory device according to claim 11, wherein said charging means is activated during data read operation.

14. A nonvolatile semiconductor memory device according to claim 7, wherein a preselected number of said plurality of memory cells form a memory cell unit, said bit line and said source line are coupled to said memory cell unit, and said charging means includes means for charging said control gate and said bit line at the same time.

15. The nonvolatile semiconductor memory device according to claim 7, wherein said charging means includes means for charging control gates of said memory cell unit before charging of said selective gate of said selective gate transistor.

16. An electrically erasable nonvolatile memory device according to claim 15, wherein said memory cell further comprising a tunnel insulating layer and charge storage layer in which charges, to define data of said memory cell, are extracted or stored through said tunnel insulating layer.

17. An electrically erasable nonvolatile memory device according to claim 15, wherein said charging means is activated during data read operation.

18. An electrically erasable nonvolatile memory device comprising:

a memory cell array including a plurality of memory cells, each comprising a MOS transistor having a control gate, said plurality of said memory cells constituting a memory cell unit which has two end portions;

a selective gate transistor having a selective gate and being coupled to one end portion of said memory cell unit;

a bit line coupled to said memory cell unit via said selective gate transistor;

a source line coupled to the other end portion of said memory cell unit; and charging means for charging control gates of the MOS transistor prior to charging said selective gate of said selective gate transistor.

19. The electrically erasable nonvolatile memory device according to claim 18, wherein:

each of said memory cells further comprises a tunnel insulating layer and charge storage layer in which charges, to define data of said memory cell, are extracted or stored through said tunnel insulating layer.

20. The electrically erasable nonvolatile memory device according to claim 18, wherein:

said charging means is activated during a data read operation.

21. The electrically erasable nonvolatile memory device according to claim 18, wherein:

said memory cells are connected in series to provide a NAND structure.

22. The electrically erasable nonvolatile memory device according to claim 18, wherein:

said charging means includes means for charging said control gates of said memory cells and said bit line at the same time.

* * * * *